(12) United States Patent
Toyotaka et al.

(10) Patent No.: US 10,475,869 B2
(45) Date of Patent: Nov. 12, 2019

(54) DISPLAY DEVICE INCLUDING DISPLAY ELEMENT AND TRANSISTOR

(71) Applicant: Semiconductor Energy Laboratory Co., Ltd., Atsugi-shi, Kanagawa-ken (JP)

(72) Inventors: Kouhei Toyotaka, Kanagawa (JP); Hiroyuki Miyake, Aichi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 137 days.

(21) Appl. No.: 15/681,844

(22) Filed: Aug. 21, 2017

(65) Prior Publication Data

US 2018/0061919 A1  Mar. 1, 2018

(30) Foreign Application Priority Data

Aug. 23, 2016 (JP) .................................. 2016-162391

(51) Int. Cl.
*G02F 1/136* (2006.01)
*H01L 27/32* (2006.01)
(Continued)

(52) U.S. Cl.
CPC ...... *H01L 27/3262* (2013.01); *G02F 1/13624* (2013.01); *H01L 27/3213* (2013.01);
(Continued)

(58) Field of Classification Search
CPC ..... G02F 1/13624; G02F 2001/136245; G02F 2201/44; G02F 1/13762;
(Continued)

(56) References Cited

U.S. PATENT DOCUMENTS 7,084,936 B2 * 8/2006 Kato ................. G02F 1/133553
257/E31.095
8,378,403 B2   2/2013 Kato
(Continued)

FOREIGN PATENT DOCUMENTS

JP  2011-248351 A  12/2011

*Primary Examiner* — Paisley L Arendt
(74) *Attorney, Agent, or Firm* — Fish & Richardson P.C.

(57) ABSTRACT

A display device with high luminance and excellent white balance is provided. The display device includes a first display element, a second display element, a first transistor, and a second transistor. The first display element includes a light-emitting layer and is electrically connected to the first transistor. The first transistor includes a first semiconductor film, a first gate electrode and a second gate electrode facing each other with the first semiconductor film provided therebetween, and a first source electrode and a first drain electrode over and in contact with the first semiconductor film. The second gate electrode is electrically connected to the first source electrode or the first drain electrode. The second display element includes a light-emitting layer and is electrically connected to the second transistor. The second transistor includes a second semiconductor film, and a third gate electrode and a fourth gate electrode facing each other with the second semiconductor film provided therebetween. The fourth gate electrode is electrically connected to the third gate electrode.

14 Claims, 31 Drawing Sheets

(51) Int. Cl.
*G02F 1/1362* (2006.01)
*H01L 29/786* (2006.01)
*G02F 1/1335* (2006.01)
*H01L 27/12* (2006.01)
*H01L 51/05* (2006.01)

(52) U.S. Cl.
CPC .... *H01L 27/3232* (2013.01); *H01L 29/78648* (2013.01); *G02F 1/133553* (2013.01); *G02F 2001/133618* (2013.01); *G02F 2001/133626* (2013.01); *G02F 2201/44* (2013.01); *G02F 2203/02* (2013.01); *H01L 27/1225* (2013.01); *H01L 27/323* (2013.01); *H01L 29/7869* (2013.01); *H01L 51/0554* (2013.01)

(58) Field of Classification Search
CPC ........ G02F 2001/133618; G02F 2001/133626; H01L 27/3262; H01L 27/3232; H01L 27/3213; H01L 29/78648
See application file for complete search history.

(56) References Cited

U.S. PATENT DOCUMENTS

| | | | |
|---|---|---|---|
| 8,637,865 B2 | 1/2014 | Kato | |
| 8,760,959 B2 | 6/2014 | Matsubayashi | |
| 8,860,022 B2 | 10/2014 | Sasaki et al. | |
| 8,981,367 B2 | 3/2015 | Yoneda et al. | |
| 9,349,325 B2 | 5/2016 | Yamazaki et al. | |
| 9,385,128 B2 | 7/2016 | Matsubayashi | |
| 9,397,308 B2 | 7/2016 | Seo et al. | |
| 9,472,680 B2 | 10/2016 | Yoneda et al. | |
| 9,494,830 B2 | 11/2016 | Yamazaki et al. | |
| 9,508,861 B2 | 11/2016 | Yamazaki et al. | |
| 9,564,482 B2 | 2/2017 | Teraguchi et al. | |
| 9,728,556 B2 | 8/2017 | Yamazaki et al. | |
| 2013/0153890 A1 | 6/2013 | Yoneda | |
| 2014/0138778 A1 | 5/2014 | Kato | |
| 2014/0361290 A1 | 12/2014 | Yamazaki et al. | |
| 2015/0279918 A1* | 10/2015 | Teraguchi | H01L 27/3276 257/40 |
| 2016/0027851 A1 | 1/2016 | Yanagisawa et al. | |
| 2016/0225325 A1 | 8/2016 | Yamazaki et al. | |
| 2016/0307901 A1 | 10/2016 | Matsubayashi | |
| 2017/0033130 A1 | 2/2017 | Yoneda et al. | |
| 2017/0052415 A1 | 2/2017 | Yamazaki et al. | |
| 2017/0139253 A1 | 5/2017 | Hirakata et al. | |
| 2017/0186778 A1 | 6/2017 | Miyake et al. | |
| 2017/0309650 A1 | 10/2017 | Yamazaki et al. | |
| 2017/0317151 A1 | 11/2017 | Miyake et al. | |

\* cited by examiner

10

10

10

10

10

10

DISPLAY DEVICE INCLUDING DISPLAY ELEMENT AND TRANSISTOR

BACKGROUND OF THE INVENTION

1. Field of the Invention

One embodiment of the present invention relates to a display device and a manufacturing method thereof.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a driving method of any of them, and a method for manufacturing any of them.

2. Description of the Related Art

A liquid crystal display device in which a surface-emitting light source is provided as a backlight and combined with a transmissive liquid crystal display device in order to reduce power consumption and suppress a reduction in display quality is known (see Patent Document 1).

REFERENCE

Patent Document

[Patent Document 1] Japanese Published Patent Application No. 2011-248351

SUMMARY OF THE INVENTION

In recent years, a display device with high definition and high luminance has been required. However, with the miniaturization of pixels, a formation area of transistors and wirings that occupies one pixel is increased; thus, an aperture ratio of the pixel is lowered, and luminous intensity obtained from the one pixel is decreased.

In view of the above, an object of one embodiment of the present invention is to provide a display device with high luminance. Another object of one embodiment of the present invention is to provide a display device with excellent white balance. Another object of one embodiment of the present invention is to provide a display device with high definition. Another object of one embodiment of the present invention is to provide a display device that is highly convenient. Another object of one embodiment of the present invention is to provide a novel display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a first display element, a second display element having a luminance lower than a luminance of the first display element, a first transistor electrically connected to the first display element, and a second transistor electrically connected to the second display element. The first transistor and the second transistor each include a first gate electrode, a second gate electrode, and a semiconductor film interposed therebetween. The first gate electrode of the first transistor and a source electrode or a drain electrode of the first transistor are electrically connected to the first display element. Furthermore, the first gate electrode of the second transistor and the second gate electrode of the second transistor are electrically connected to each other. Electrically connecting the first gate electrode of the first transistor and the source electrode or the drain electrode of the first transistor to the first display element has an effect of controlling the threshold of the first transistor. Electrically connecting the first gate electrode of the second transistor to the second gate electrode of the second transistor has an effect of increasing the amount of current flowing through the second display element; therefore, the luminance of the second display element can be higher than the luminance of the first display element. As a result, the luminance of the display device including the first display element and the second display element can be increased. In addition, white balance can be improved.

One embodiment of the present invention is a display device including a first display element, a second display element, a first transistor, and a second transistor. The first display element includes a first light-emitting layer and is electrically connected to the first transistor. The first transistor includes a first semiconductor film, a first gate electrode and a second gate electrode facing each other with the first semiconductor film provided therebetween, and a first source electrode and a first drain electrode over and in contact with the first semiconductor film. The second gate electrode is electrically connected to the first source electrode or the first drain electrode. The second display element includes a second light-emitting layer and is electrically connected to the second transistor. The second transistor includes a second semiconductor film, and a third gate electrode and a fourth gate electrode facing each other with the second semiconductor film provided therebetween. The fourth gate electrode is electrically connected to the third gate electrode.

Another embodiment of the present invention is a display device including a first display element, a second display element, a first transistor, and a second transistor. The first display element includes a first light-emitting layer. The first transistor includes a first semiconductor film, a first gate electrode and a second gate electrode facing each other with the first semiconductor film provided therebetween, and a first source electrode and a first drain electrode over and in contact with the first semiconductor film. One of the first source electrode and the first drain electrode is electrically connected to the second gate electrode and is electrically connected to the first display element. The second display element includes a second light-emitting layer. The second transistor includes a second semiconductor film, a third gate electrode and a fourth gate electrode facing each other with the second semiconductor film provided therebetween, and a second source electrode and a second drain electrode over and in contact with the second semiconductor film. The fourth gate electrode is electrically connected to the third gate electrode. One of the second source electrode and the second drain electrode is electrically connected to the second display element.

In the above-described display device of one embodiment of the present invention, the first light-emitting layer preferably emits one of red light, green light, and white light, and the second light-emitting layer preferably emits blue light.

The above-described display device of one embodiment of the present invention preferably includes a third display element including a liquid crystal layer.

In the above-described display device of one embodiment of the present invention, one of the first light-emitting layer and the second light-emitting layer preferably has a function of emitting light toward the liquid crystal layer side.

In the above-described display device of one embodiment of the present invention, one of the first transistor and the second transistor preferably includes a metal oxide in the semiconductor film.

Another embodiment of the present invention is a display module including the above-described display device and a touch sensor.

Another embodiment of the present invention is an electronic device including the above-described display device or the above-described display module, and an operation key or a battery.

One embodiment of the present invention provides a display device with high luminance. One embodiment of the present invention provides a display device with excellent white balance. One embodiment of the present invention provides a display device with high definition. One embodiment of the present invention provides a display device that is highly convenient. One embodiment of the present invention provides a novel display device.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
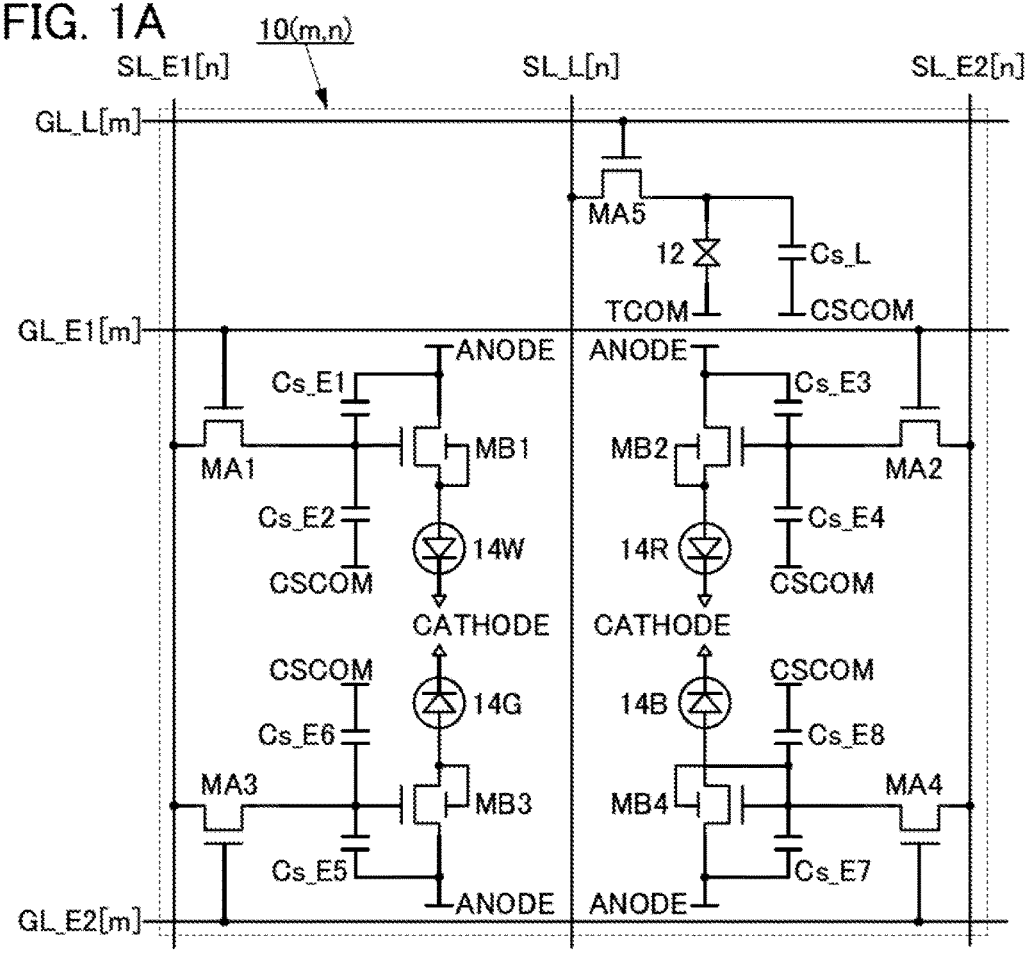
FIGS. 1A and 1B are a circuit diagram illustrating a pixel and a top view illustrating a layout of the pixel.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Ordinal numbers such as "first", "second", and "third" in this specification are used in order to avoid confusion among components, and the terms do not limit the components numerically.

In this specification, terms for describing arrangement, such as "over", "above", "under", and "below", are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region.

Note that in this specification and the like, a channel formation region refers to a region through which current mainly flows.

Furthermore, functions of a source and a drain are sometimes replaced with each other when transistors having different polarities are employed or a direction of current flow is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Embodiment 1

In this embodiment, a display device of one embodiment of the present invention and the manufacturing method thereof are described with reference to FIGS. 1A and 1B, FIG. 2, FIG. 3, FIG. 4, FIG. 5, FIG. 6, FIGS. 7A and 7B, FIGS. 8A and 8B, FIGS. 9A and 9B, FIGS. 10A and 10B, FIGS. 11A and 11B, FIGS. 12A and 12B, FIG. 13, FIG. 14, FIG. 15, FIG. 16, FIG. 17, FIG. 18, FIG. 19, FIG. 20, FIG. 21, FIG. 22, FIG. 23, and FIG. 24.

<1-1. Structure of Display Device>

First, the structure of the display device is described with reference to FIG. 2. A display device 500 illustrated in FIG. 2 includes a pixel portion 502, gate driver circuit portions 504a and 504b which are placed outside the pixel portion 502, and a source driver circuit portion 506 which is placed outside the pixel portion 502.

[Pixel Portion]

The pixel portion 502 includes pixels 10(1, 1) to 10(X, Y) arranged in X rows (X is a natural number of 2 or more) and Y columns (Y is a natural number of 2 or more). Each of the pixels 10(1, 1) to 10(X, Y) includes a first display element, a second display element, and a third display element. The first display element and the second display element have a function that is different from a function of the third display element. The first display element and the second display element have a function of emitting light, and the third display element has a function of reflecting incident light. Note that a structure in which the third display element is not provided and only the first display element and the second display element are provided may be employed. The details of the first to third display elements are described later.

[Gate Driver Circuit Portion]

Some or all of the gate driver circuit portions 504a and 504b and the source driver circuit portion 506 are preferably formed over a substrate over which the pixel portion 502 is formed. Thus, the number of components and the number of terminals can be reduced. In the case where some or all of the gate driver circuit portions 504a and 504b and the source driver circuit portion 506 are not formed over the substrate over which the pixel portion 502 is formed, a separately prepared driver circuit board (e.g., a driver circuit board formed using a single crystal semiconductor film or a polycrystalline semiconductor film) may be formed in the display device 500 by chip on glass (COG) or tape automated bonding (TAB).

The gate driver circuit portions 504a and 504b have a function of outputting a signal (a scan signal) for selecting the pixels 10(1, 1) to 10(X, Y). The source driver circuit portion 506 has a function of supplying a signal (a data signal) for driving the display elements included in the pixels 10(1, 1) to 10(X, Y).

The gate driver circuit portion 504a has a function of controlling the potentials of wirings supplied with scan signals (hereinafter, such wirings are referred to as a scan line GL_L[m], a scan line GL_L[m+1], and a scan line GL_L[X]) or a function of supplying an initialization signal. The gate driver circuit portion 504b has a function of controlling the potentials of wirings supplied with scan signals (hereinafter, such wirings are referred to as a scan line GL_E1[m], a scan line GL_E1[m+1], a scan line GL_E2[m], a scan line GL_E2[m+1], a scan line GL_E1[X], and a scan line GL_E2[X]) or a function of supplying an initialization signal. In the above, m is a natural number less than or equal to X.

Without being limited to the above functions, the gate driver circuit portions 504a and 504b may each have a function of controlling or supplying another signal.

Figure 2:
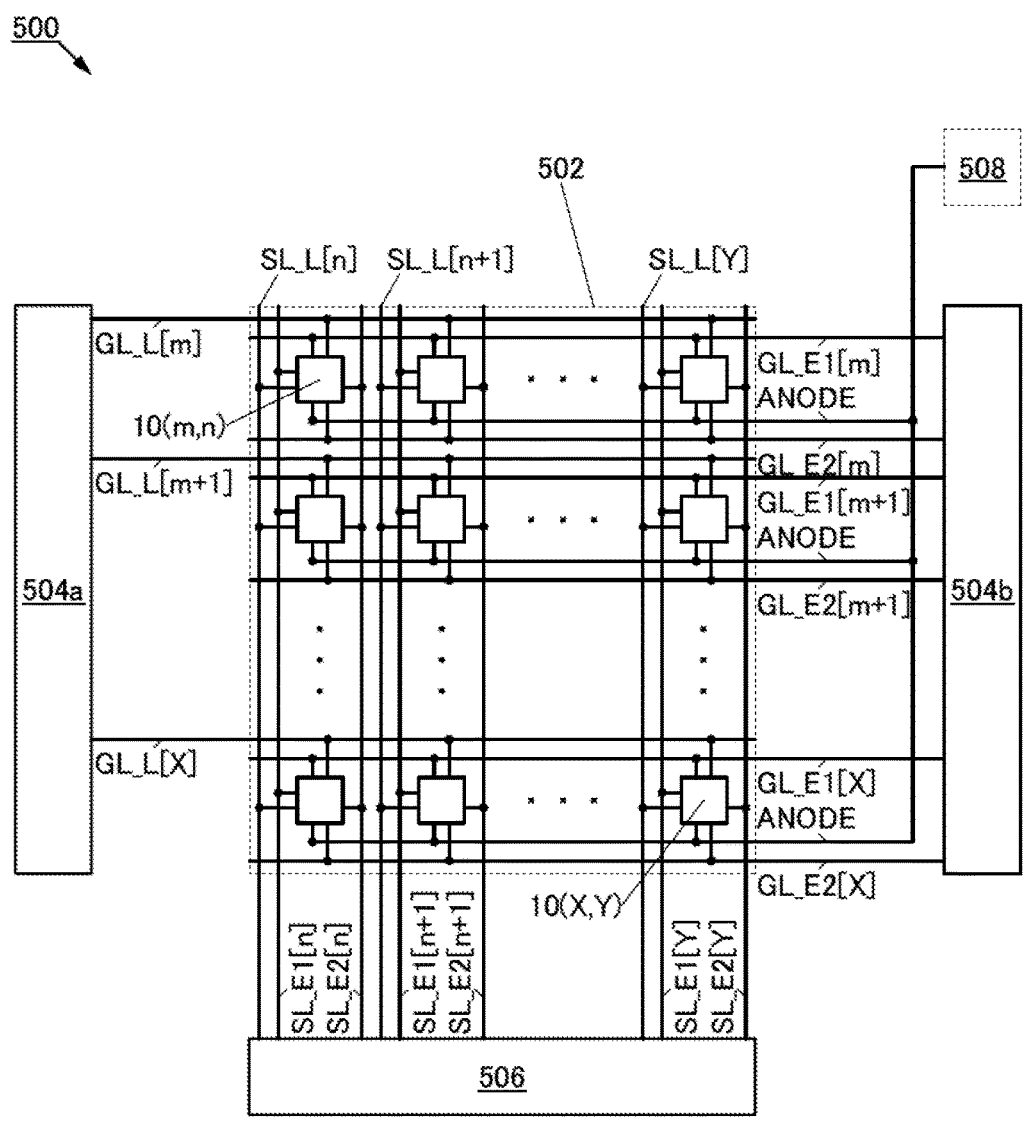
FIG. 2 is a block diagram illustrating a display device.

Although the structure in which the two gate driver circuit portions 504a and 504b are provided as gate driver circuit portions is illustrated in FIG. 2, the number of the gate driver circuit portions is not limited thereto, and one or three or more gate driver circuit portions may be provided.

[Source Driver Circuit Portion]

The source driver circuit portion 506 has a function of generating a data signal to be written to the pixels 10(1, 1) to 10(X, Y) on the basis of an image signal, a function of controlling the potentials of wirings to which data signals are supplied (signal lines SL_L[n], SL_L[n+1], SL_L[Y], SL_E1[n], SL_E1[n+1], SL_E1[Y], SL_E2[n], SL_E2[n+1], and SL_E2[Y]), or a function of supplying an initialization signal. Note that in the above description, n is a natural number less than or equal to Y.

Without being limited to the above functions, the source driver circuit portion 506 may have a function of generating, controlling, or supplying another signal.

The source driver circuit portion 506 includes a plurality of analog switches or the like. The source driver circuit portion 506 can output, as data signals, time-divided image signals obtained by sequentially turning on the plurality of analog switches.

Although the structure where one source driver circuit portion 506 is provided is illustrated in FIG. 2, the number of the source driver circuit portions is not limited thereto, and a plurality of source driver circuit portions may be provided in the display device 500. For example, two source driver circuit portions may be provided so that the signal lines SL_L[n], SL_L[n+1], and SL_L[Y] are controlled by one of the source driver circuit portions and the signal lines SL_E1[n], SL_E1[n+1], SL_E1[Y], SL_E2[n], SL_E2[n+1], and SL_E2[Y] are controlled by the other of the source driver circuit portions.

[Pixel]

A pulse signal is input to each of the pixels 10(1, 1) to 10(X, Y) through one of the scan lines GL_L[m], GL_L[m+1], GL_L[X], GL_E1[m], GL_E1[m+1], GL_E1[X], GL_E2[m], GL_E2[m+1], and GL_E2[X]. A data signal is input to each of the pixels 10(1, 1) to 10(X, Y) through one of the signal lines SL_L[n], SL_L[n+1], SL_L[Y], SL_E1[n], SL_E1[n+1], SL_E1[Y], SL_E2[n], SL_E2[n+1], and SL_E2[Y].

For example, to the pixel 10(m, n) in the m-th row and the n-th column, a pulse signal is input from the gate driver circuit portion 504a through the scan line GL_L[m], and a data signal is input from the source driver circuit portion 506 through the signal line SL_L[n] in accordance with the potential of the scan line GL_L[m].

Furthermore, the pixel 10(m, n) in the m-th row and the n-th column is supplied with pulse signals from the gate driver circuit portion 504b through the scan lines GL_E1[m] and GL_E2[m] and supplied with data signals from the source driver circuit portion 506 through the signal lines SL_E1[n] and SL_E2[n] in accordance with the potentials of the scan lines GL_E1[m] and GL_E2[m].

Furthermore, the pixel 10(m, n) includes the first to third display elements as described above. The scan lines GL_L[m], GL_L[m+1], and GL_L[X] are wirings which control the potential of the third display element. The scan lines GL_E1[m], GL_E1[m+1], GL_E1[X], GL_E2[m], GL_E2[m+1], and GL_E2[X] are wirings which control the potentials of the first display element and the second display element.

Furthermore, the signal lines SL_L[n], SL_L[n+1], and SL_L[Y] are wirings which control the potential of the third display element. The signal lines SL_E1[n], SL_E1[n+1], SL_E1[Y], SL_E2[n], SL_E2[n+1], and SL_E2[Y] are wirings which control the potentials of the first display element and the second display element.

[External Circuit]

An external circuit 508 is connected to the display device 500. Note that the display device 500 may include the external circuit 508.

As shown in FIG. 2, the external circuit 508 is electrically connected to a wiring ANODE which is supplied with an anode potential.

<1-2. Circuit Configuration of Pixel>

Next, a circuit configuration of the pixel 10(m, n) is described with reference to FIGS. 1A and 1B.

FIG. 1A is a circuit diagram showing the pixel 10(m, n) which is included in the display device 500 of one embodiment of the present invention.

The pixel 10(m, n) includes the scan lines GL_L[m], GL_E1[m], and GL_E2[m] and the signal lines SL_E1[n], SL_L[n], and SL_E2[n]. The pixel 10(m, n) includes transistors MA1 to MA5, transistors MB1 to MB4, a capacitor Cs_L, capacitors Cs_E1 to Cs_E8, a display element 12, and a display element 14. In FIG. 1A, the display element 14 includes a display element 14B, a display element 14G, a display element 14R, and a display element 14W. The display element 14B has a function of emitting blue light. The display element 14G has a function of emitting green light. The display element 14R has a function of emitting red light. The display element 14W has a function of emitting white light.

The pixel 10(m, n) includes a wiring TCOM electrically connected to the display element 12, a wiring CSCOM electrically connected to the capacitor Cs_L and the capacitors Cs_E1 to Cs_E8, a wiring CATHODE electrically connected to the display element 14, and the wiring ANODE electrically connected to the transistors MB1 to MB4.

Each of the scan line GL_L[m], the signal line SL_L[n], the wiring CSCOM, and the wiring TCOM is a wiring for supplying a signal and electric power to the display element 12. Each of the scan line GL_E1[m], the scan line GL_E2[m], the signal line SL_E1[n], the signal line SL_E2[n], the wiring ANODE, and the wiring CATHODE is a wiring for supplying a signal and electric power to the display element 14.

Figure 1B:
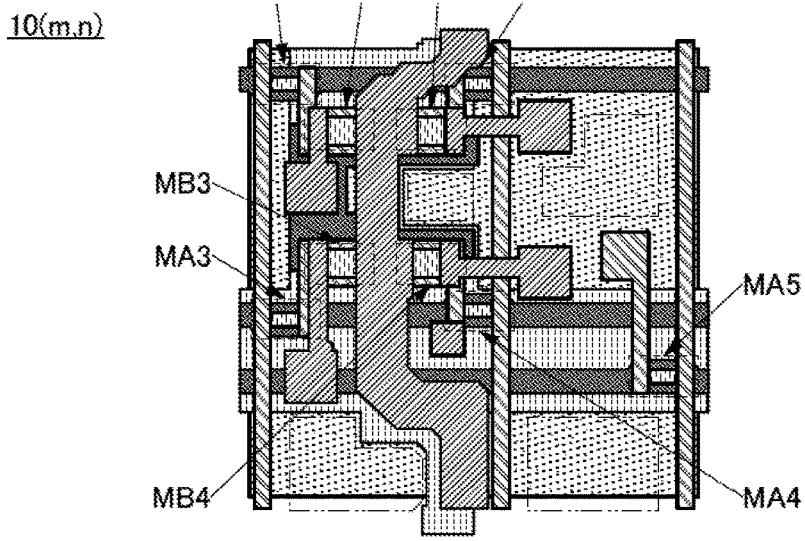

FIG. 1B is a top plan view of a layout of the pixel 10(m, n). The pixel 10(m, n) includes the transistors MA1 to MA5 and the transistors MB1 to MB4.

<1-3. Structure Example of First Display Element>

The display element 14W, the display element 14R, and the display element 14G have a function of emitting light. Therefore, the display element 14W, the display element 14R, and the display element 14G may be rephrased as light-emitting elements. For example, electroluminescent elements (also referred to as EL elements) or light-emitting diodes or the like may be used as the display element 14W, the display element 14R, and the display element 14G.

<1-4. Structure Example of Second Display Element>

The display element 14B has a function of emitting light. Therefore, the display element 14B may be rephrased as a light-emitting element. For example, an electroluminescence element (also referred to as an EL element), or a light-emitting diode may be used as the display element 14B.

<1-5. Structure Example of Third Display Element>

The display element 12 has a function of controlling transmission or reflection of light. In particular, the display element 12 is preferably a reflective display element which controls reflection of light. The display element 12 serving as a reflective display element can reduce power consumption of the display device because display can be performed with the use of external light. For example, the display element 12 may have a combined structure of a reflective film, a liquid crystal element, and a polarizing plate, a structure using micro electro mechanical systems (MEMS), or the like.

In this manner, display elements with different functions are used for the display element 12, the display element 14B, the display element 14G, the display element 14R, and the display element 14W. A display device that is highly convenient can be provided when a reflective liquid crystal element is used as one or more of the display elements and a transmissive EL element is used as the others of the display elements, for example. Furthermore, a display device with low power consumption and high display quality can be provided when the reflective liquid crystal element is used in an environment with bright external light and the transmissive EL element is used in an environment with weak external light.

<1-6. Driving Method of Display Elements>

Next, a driving method of the display element 12 and the display element 14 is described with reference to FIG. 1A. Note that in the following description, light-emitting elements are used as the display element 14G, the display element 14R, and the display element 14W which serve as the first display element. A light-emitting element is used as the display element 14B which serves as the second display element. A liquid crystal element is used as the display element 12 which serves as the third display element.

[Driving Method of First Display Element]

In the pixel 10(m, n) illustrated in FIG. 1A, a gate electrode of the transistor MA1 is electrically connected to the scan line GL_E1[m]. One of a source electrode and a drain electrode of the transistor MA1 is electrically connected to the signal line SL_E1[n] and the other of the source electrode and the drain electrode is electrically connected to a gate electrode of the transistor MB1, one electrode of the capacitor Cs_E1, and one electrode of the capacitor Cs_E2. The transistor MA1 has a function of controlling whether to write a data signal by switching the on and off states.

One of a source electrode and a drain electrode of the transistor MB1 is electrically connected to one of a pair of electrodes of the display element 14W. The other of the source electrode and the drain electrode of the transistor MB1 is electrically connected to the wiring ANODE. The other of the pair of electrodes of the display element 14W is electrically connected to the wiring CATHODE. The transistor MB1 functions as a driving transistor which controls current supplied to the display element 14W.

The transistor MB1 is a dual-gate transistor including a first gate electrode and a second gate electrode over and below the semiconductor film. In this specification, the first gate electrode is referred to as a front gate electrode, and the second gate electrode is referred to as a back gate electrode. The back gate electrode of the transistor MB1 is electrically connected to one of the source electrode and the drain electrode of the transistor MB1, so that the potential of the back channel side of the transistor can be fixed. Such a structure enables control of the threshold voltage of the transistor. Thus, off-state current of the transistor can be reduced.

The capacitor Cs_E1 is formed between the front gate electrode of the transistor MB1 and the wiring ANODE. The capacitor Cs_E2 is formed between the front gate electrode of the transistor MB1 and the wiring CSCOM. The capacitors have a function of storing data written to the pixel 10(m, n).

In the pixel 10(m, n) illustrated in FIG. 1A, a gate electrode of the transistor MA2 is electrically connected to the scan line GL_E1 [m]. One of a source electrode and a drain electrode of the transistor MA2 is electrically connected to the signal line SL_E2[n] and the other of the source electrode and the drain electrode is electrically connected to a gate electrode of the transistor MB2, one electrode of the capacitor Cs_E3, and one electrode of the capacitor Cs_E4. The transistor MA2 has a function of controlling whether to write a data signal by switching the on and off states.

One of a source electrode and a drain electrode of the transistor MB2 is electrically connected to one of a pair of electrodes of the display element 14R. The other of the source electrode and the drain electrode of the transistor MB2 is electrically connected to the wiring ANODE. The other of the pair of electrodes of the display element 14R is electrically connected to the wiring CATHODE. The transistor MB2 functions as a driving transistor which controls current supplied to the display element 14R.

The transistor MB2 is a dual-gate transistor including the front gate electrode and the back gate electrode over and below the semiconductor film. The back gate electrode of the transistor MB2 is electrically connected to one of the source electrode and the drain electrode of the transistor MB2, so that the potential of the back channel side of the transistor can be fixed.

The capacitor Cs_E3 is formed between the front gate electrode of the transistor MB2 and the wiring ANODE. The capacitor Cs_E4 is formed between the front gate electrode of the transistor MB2 and the wiring CSCOM. The capacitors have a function of storing data written to the pixel 10(m, n).

In the pixel 10(m, n) illustrated in FIG. 1A, a gate electrode of the transistor MA3 is electrically connected to the scan line GL_E2[m]. One of a source electrode and a drain electrode of the transistor MA3 is electrically connected to the signal line SL_E1[n] and the other of the source electrode and the drain electrode is electrically connected to a gate electrode of the transistor MB3, one electrode of the capacitor Cs_E5, and one electrode of the capacitor Cs_E6. The transistor MA3 has a function of controlling whether to write a data signal by switching the on and off states.

One of a source electrode and a drain electrode of the transistor MB3 is electrically connected to one of a pair of electrodes of the display element 14G. The other of the source electrode and the drain electrode of the transistor MB3 is electrically connected to the wiring ANODE. The other of the pair of electrodes of the display element 14G is electrically connected to the wiring CATHODE. The transistor MB3 functions as a driving transistor which controls current supplied to the display element 14G.

The transistor MB3 is a dual-gate transistor including the front gate electrode and the back gate electrode over and below the semiconductor film. The back gate electrode of the transistor MB3 is electrically connected to one of the source electrode and the drain electrode of the transistor MB3, so that the potential of the back channel side of the transistor can be fixed.

The capacitor Cs_E5 is formed between the front gate electrode of the transistor MB3 and the wiring ANODE. The capacitor Cs_E6 is formed between the front gate electrode of the transistor MB3 and the wiring CSCOM. The capacitors have a function of storing data written to the pixel 10(m, n).

[Driving Method of Second Display Element]

In the pixel 10(m, n) illustrated in FIG. 1A, a gate electrode of the transistor MA4 is electrically connected to the scan line GL_E2[m]. One of a source electrode and a drain electrode of the transistor MA4 is electrically connected to the signal line SL_E2[n] and the other of the source electrode and the drain electrode is electrically connected to a gate electrode of the transistor MB4, one electrode of the capacitor Cs_E7, and one electrode of the capacitor Cs_E8. The transistor MA4 has a function of controlling whether to write a data signal by switching the on and off states.

One of a source electrode and a drain electrode of the transistor MB4 is electrically connected to one of a pair of electrodes of the display element 14B. The other of the source electrode and the drain electrode of the transistor MB4 is electrically connected to the wiring ANODE. The other of the pair of electrodes of the display element 14B is electrically connected to the wiring CATHODE. The transistor MB4 functions as a driving transistor which controls current supplied to the display element 14B.

The transistor MB4 is a dual-gate transistor including the front gate electrode and the back gate electrode over and below the semiconductor film. The back gate electrode of the transistor MB4 is electrically connected to the front gate electrode of the transistor MB4, so that the current drive capability of the transistor can be improved.

The capacitor Cs_E7 is formed between the front gate electrode of the transistor MB4 and the wiring ANODE. The capacitor Cs_E8 is formed between the front gate electrode of the transistor MB4 and the wiring CSCOM. The capacitors have a function of storing data written to the pixel 10(m, n).

For example, the gate driver circuit portion 504b in FIG. 2 sequentially selects the pixels 10(m, 1) to 10(m, Y') row by row to turn on the transistors MA1 to MA4 and write data of data signals. When the transistors MA1 to MA4 are turned off, the pixels 10(m, 1) to 10(m, Y') to which the data has been written are brought into a retention state. Furthermore, the amount of current flowing between the source electrodes and the drain electrodes of the transistors MB1 to MB4 is controlled in accordance with the potential of the written data signals. The display element 14 emits light with a luminance corresponding to the amount of flowing current. This operation is sequentially performed row by row; thus, an image can be displayed.

As described above, in each of the transistor MB1, the transistor MB2, and the transistor MB3, the front gate electrode is electrically connected to one of the source electrode and the drain electrode. The transistor MB1 drives the display element 14W that serves as the first display element having a function of emitting white light. The transistor MB2 drives the display element 14R that serves as the first display element having a function of emitting red light. The transistor MB3 drives the display element 14G that serves as the first display element having a function of emitting green light. In contrast, the front gate electrode is electrically connected to the back gate electrode in the transistor MB4. The transistor MB4 drives the display element 14B that serves as the second display element having a function of emitting blue light. With this structure, the current drive capability of the transistor MB4 can be improved as compared with those of the transistors MB1 to MB3. The current flowing through the second display element 14B emitting blue light can be larger than the current flowing through the first display element 14W, the first display element 14R, and the first display element 14G emitting white light, red light, and green light, respectively; therefore, luminance of blue light emitted by the display element 14B is increased. Thus, luminance of the display device can be increased.

Furthermore, even if densities of current flowing through driving transistors are the same, emission luminance may vary depending on the EL materials. When the balance among the luminances of red, blue, and green light is poor, white balance of the display device can deteriorate in some cases. When a blue EL material is used in the display element 14B that exhibits low luminance, luminance of blue light emitted by the display element 14B can be increased by using the transistor MB4 having high current drive capability. Therefore, the balance among the luminances of red, green, and blue light can be improved, and white balance of the display device can be improved.

The transistor which drives the second display element, in which the back gate electrode is electrically connected to the front gate electrode, has a larger formation area of wirings as compared with the transistor which drives the first display element, in which the back gate electrode is electrically connected to one of the source electrode and the drain electrode; therefore, an aperture ratio of pixels is lowered in some cases. By applying the structure for the second display element in which the back gate electrode is electrically connected to the front gate electrode to only the transistor which drives a light-emitting element whose luminance is required to be high, a decrease in the aperture ratio of pixels can be prevented and a display device with high definition can be manufactured.

In this manner, in the display device according to one embodiment of the present invention, a display device with high luminance, excellent white balance, and high definition can be provided.

Note that although the structure where a blue-light emitting display element is used as the second display element and the luminance of the blue light is enhanced is shown as an example, one embodiment of the present invention is not limited to this structure. Colors other than blue may be applied for the second display element. Alternatively, two or more colors may be applied for the second display element.

[Driving Method of Third Display Element]

In the pixel 10(m, n), a gate electrode of the transistor MA5 is electrically connected to the scan line GL_L[m]. One of a source electrode and a drain electrode of the transistor MA5 is electrically connected to the signal line SL_L[n], and the other is electrically connected to one of a pair of electrodes of the display element 12. The transistor MA5 has a function of controlling whether to write a data signal by switching the on and off states.

The other of the pair of electrodes of the display element 12 is electrically connected to the wiring TCOM.

One of a pair of electrodes of the capacitor Cs_L is electrically connected to the other of the source electrode and the drain electrode of the transistor MA5 and one of the pair of electrodes of the display element 12, and the other of the pair of electrodes of the capacitor Cs_L is electrically connected to the wiring CSCOM. The capacitor Cs_L has a function of storing data written to the pixel 10(m, n). The wiring CSCOM has an effect of suppressing transmission of noise generated in the display element 12 to at least one of the front gate electrode and the back gate electrode of the transistors MB1 to MB4.

For example, the gate driver circuit portion 504a in FIG. 2 selects the pixels 10(m, 1) to 10(m, Y) row by row to turn on the transistor MA5 and write data of data signals. When the transistor MA5 is turned off, the pixels 10(m, 1) to 10(m, Y) to which the data has been written is brought into a retention state. This operation is sequentially performed row by row; thus, an image can be displayed.

Alternatively, a structure in which the third display element is not provided and only the first display element and the second display element are provided may be employed.

Each of the transistors MA1 to MA5 and the transistors MB1 to MB4 used in the display device of one embodiment of the present invention preferably includes a metal oxide in its semiconductor film. The transistor including a metal oxide can have relatively high field-effect mobility and thus can operate at high speed. The off-state current of the transistor including a metal oxide is extremely low. Therefore, the luminance of the display device can be kept even when the refresh rate of the display device is lowered, so that power consumption can be lowered.

A progressive type display, an interlace type display, or the like can be employed as the display type of the display element 12 and the display element 14. Furthermore, color components controlled in a pixel at the time of color display are not limited to blue, green, red, or white. For example, one or more colors of yellow, cyan, magenta, and the like may be added to blue, green, red, or white. Furthermore, the size of a display region may be different in each dot of a color component. However, the display device of one embodiment of the present invention is not limited to a color display device and can be used for a monochrome display device.

Note that the display device 500 can perform grayscale display using at least one of the display element 12 and the display element 14. For example, since the display element 12 is the reflective liquid crystal element, visibility can be improved under strong external light. In the case where grayscale display is performed using the display element 12, a backlight or the like is not necessarily controlled; thus, power consumption can be reduced as compared to the case where a transmissive liquid crystal display device is used.

On the other hand, since the display element 14 is the light-emitting element, visibility can be improved under weak external light. In the case where grayscale display is performed using the display element 14, image quality such as contrast can be improved as compared to the case where a transmissive liquid crystal display device is used because light emission can be controlled in each pixel without using a backlight or the like.

The display device 500 may perform grayscale display using both the display element 12 and the display element 14. When grayscale display is performed using both the display element 12 and the display element 14, visibility can be improved as compared to the case where grayscale display is performed using one of the display element 12 and the display element 14.

<1-7. Display Region of Display Element>

Next, display regions of the display element 12 and the display element 14 in the pixel 10(m, n) are described with reference to FIG. 3.

Figure 3:
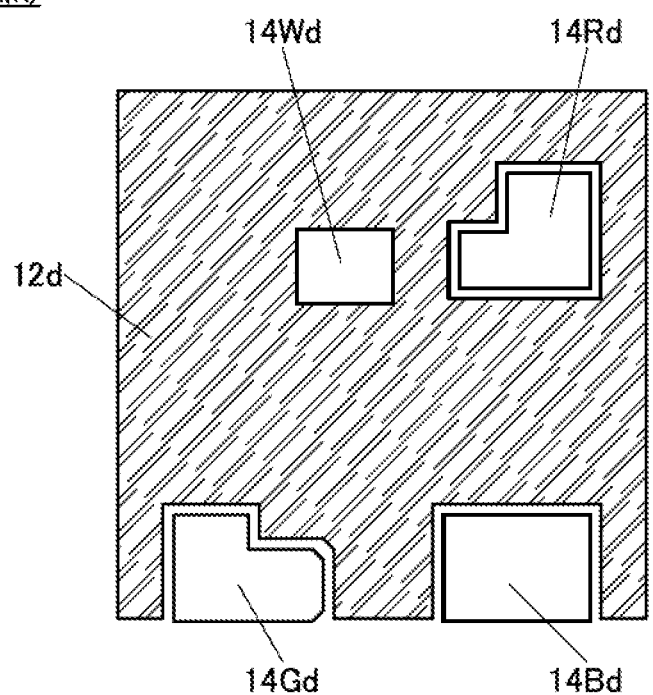
FIG. 3 is a schematic view illustrating a display region of a display element.

FIG. 3 is a schematic view illustrating the display regions of the pixel 10(m, n).

The display regions of the pixel 10(m, n) illustrated in FIG. 3 include a display region 12d which functions as a display region of the display element 12, a display region 14Bd which functions as a display region of the display element 14B, a display region 14Gd which functions as a display region of the display element 14G, a display region 14Rd which functions as a display region of the display element 14R, and a display region 14Wd which functions as a display region of the display element 14W.

The display region 12d includes a region which reflects light. The display region 14Bd includes a region which transmits blue light. The display region 14Gd includes a region which transmits green light. The display region 14Rd includes a region which transmits red light. The display region 14Wd includes a region which transmits white light.

For example, when the display regions of the pixel 10(m, n) are provided as illustrated in FIG. 3, a monochrome image can be displayed on the display region 12d and a full-color image can be displayed on the display regions 14Bd, 14Gd, 14Rd, and 14Wd.

<1-8. Structure Example of Display Device>

Next, an example of a structure of a pixel 10 included in the display device 500 is described with reference to FIG. 4 and FIG. 5.

Figure 4:
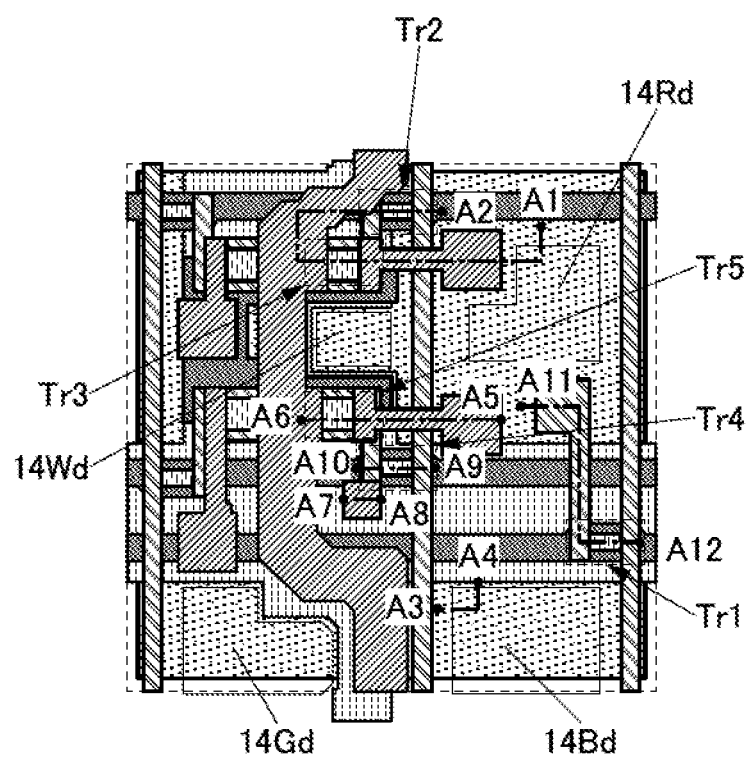
FIG. 4 is a top view illustrating a structure of a pixel included in a display device.

FIG. 4 is an example of a top view of the pixel 10. FIG. 5 is a cross-sectional view corresponding to cross sections taken along dashed-dotted lines A1-A2, A3-A4, A5-A6, A7-A8, A9-A10, and A11-A12 in FIG. 4. Note that in the top view of the pixel 10 illustrated in FIG. 4, some components are not illustrated in order to avoid complexity of the drawing. In FIG. 4, display regions adjacent to each other in the pixel (the regions corresponding to the display regions 14Rd, 14Gd, 14Bd, and 14Wd) are clearly shown. The same applies to the following top views of the pixel 10.

Figure 5:
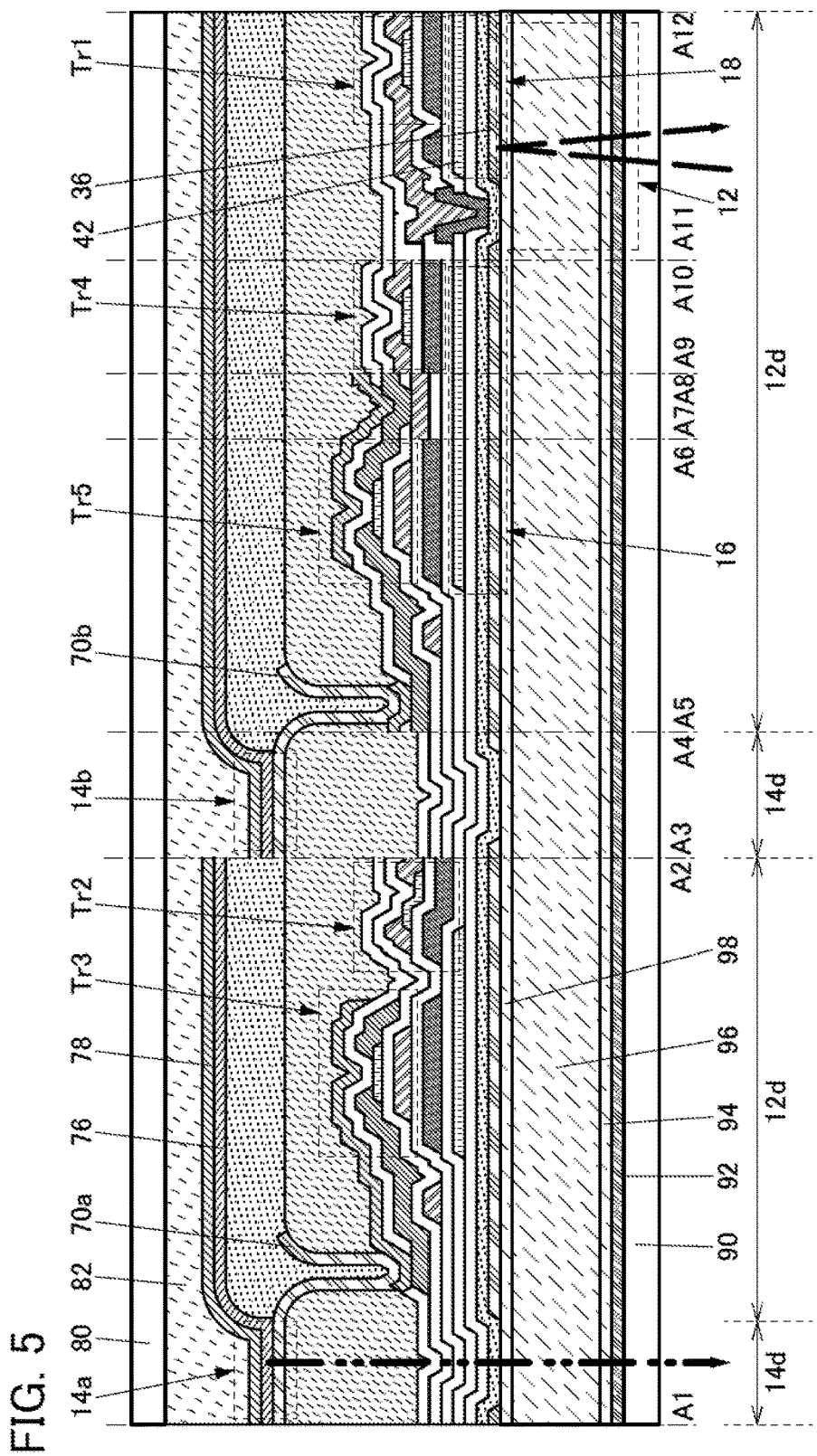
FIG. 5 is a cross-sectional view illustrating a structure of a pixel included in a display device.

In the pixel 10 illustrated in FIG. 4 and FIG. 5, the display element 12, a display element 14a, a display element 14b, and transistors Tr1 to Tr5 are provided between a substrate 80 and a substrate 90.

Note that the display element 14a corresponds to any one of the display element 14W, the display element 14R, and the display element 14G. The display element 14b corresponds to the display element 14B. The transistor Tr1 corresponds to the transistor MA5. The transistor Tr2 corresponds to any one of the transistors MA1 to MA3. The transistor Tr3 corresponds to any one of the transistors MB1 to MB3. The transistor Tr4 corresponds to the transistor MA4. The transistor Tr5 corresponds to the transistor MB4.

The display element 12 includes a liquid crystal layer 96. The display element 14a and the display element 14b each include an EL layer 76. The transistor Tr1 has a function of selecting the display element 12. The transistor Tr2 has a function of selecting the display element 14a, and the transistor Tr3 has a function of controlling driving of the display element 14a. The transistor Tr4 has a function of selecting the display element 14b, and the transistor Tr5 has a function of controlling driving of the display element 14b. The transistor Tr1, the transistor Tr2, and the transistor Tr4 are formed over the same surface. The transistor Tr3 and the transistor Tr5 are formed above the transistor Tr1, the transistor Tr2, and the transistor Tr4. The transistor Tr3 includes one of the source electrode and the drain electrode of the transistor Tr2 as a gate electrode. The transistor Tr5 includes one of the source electrode and the drain electrode of the transistor Tr4 as a gate electrode.

Note that the display element 12 includes a conductive film 36 functioning as a first pixel electrode. The transistor Tr1 is electrically connected to the conductive film 36 and has a function of selecting the display element 12. The transistor Tr3 is electrically connected to a conductive film 70a and has a function of selecting the display element 14a. The transistor Tr5 is electrically connected to a conductive film 70b and has a function of selecting the display element 14b.

The pixel 10 includes a capacitor 16 and a capacitor 18. The capacitor 16 and the capacitor 18 each include a pair of electrodes. One of the pair of electrodes includes a conductive film 42 functioning as a capacitor electrode. The other of the pair of electrodes includes the conductive film 36. The conductive film 42 is provided below the transistor Tr3 and the transistor Tr5. Note that the conductive film 42 may be provided below elements other than the transistor Tr3 and the transistor Tr5.

The capacitor 16 corresponds to the capacitors Cs_E1 to Cs_E8. The capacitor 18 corresponds to the capacitor Cs_L. The capacitors Cs_E1 to Cs_E8 and the capacitor 18 can be manufactured using the same materials in the same process.

When the conductive film 42 functioning as the capacitor electrode is provided below any one or more of the transistors Tr1 to Tr5, noise due to data rewriting of the display element 12, i.e., noise due to data rewriting of the liquid crystal element in the pixel can be reduced.

As illustrated in FIG. 5, the transistor Tr1, the transistor Tr2, and the transistor Tr4 are formed over the same surface and the transistor Tr3 and the transistor Tr5 are formed above the transistor Tr1, the transistor Tr2, and the transistor Tr4, whereby a circuit area can be reduced. The transistor Tr3 includes one of the source electrode and the drain electrode of the transistor Tr2 as a gate electrode, and the transistor Tr5 includes one of the source electrode and the drain electrode of the transistor Tr4 as a gate electrode; thus, the manufacturing process can be shortened.

As illustrated in FIG. 5, each of the transistors Tr1 to Tr5 preferably has an inverted staggered structure (also referred to as a bottom-gate structure). The transistor having a bottom gate structure can be manufactured in a relatively easy process. However, one embodiment of the present invention is not limited to this, and transistors each having a top gate structure may be used.

The display element 12 has a function of reflecting incident light. Note that the display element 12 is the liquid crystal element and includes the liquid crystal layer 96 between a pair of electrodes. One of the pair of electrodes includes the conductive film 36, and the other of the pair of electrodes includes a conductive film 92. As illustrated in FIG. 5, the display element 12 may include alignment films 94 and 98 in contact with the liquid crystal layer 96. The conductive film 36 functions as a reflective electrode. When light which enters from the outside is reflected by the conductive film 36 as shown by a dashed arrow in FIG. 5, the light can be reflected to the viewing side.

The display element 14a and the display element 14b each have a function of emitting light. Note that each of the display element 14a and the display element 14b is the light-emitting element and includes the EL layer 76 between a pair of electrodes. One of the pair of electrodes includes the conductive film 70a and the conductive film 70b, and the other of the pair of electrodes includes a conductive film 78. The conductive film 78 functions as a reflective electrode. As shown by a dashed-two dotted arrow in FIG. 5, light emitted from the EL layer 76 is reflected by the conductive film 78, passes through the conductive film 70a and the conductive film 70b, and is extracted to the liquid crystal layer 96 side. Light emitted from the display element 14 is extracted through an opening provided in the conductive film 36 to the substrate 90 side. In FIG. 5, the opening is shown as a display region 14d.

The display element 14 may be a light-emitting element in which the EL layer 76 emitting light of red (R), green (G), blue (B), and the like is formed using a fine metal mask (FMM). Note that the structure of the display element 14 is not limited thereto, and the display element 14 may be an element emitting white (W) light and the light from the element may pass through coloring films to obtain light of R, G, B, and the like.

Figure 6:
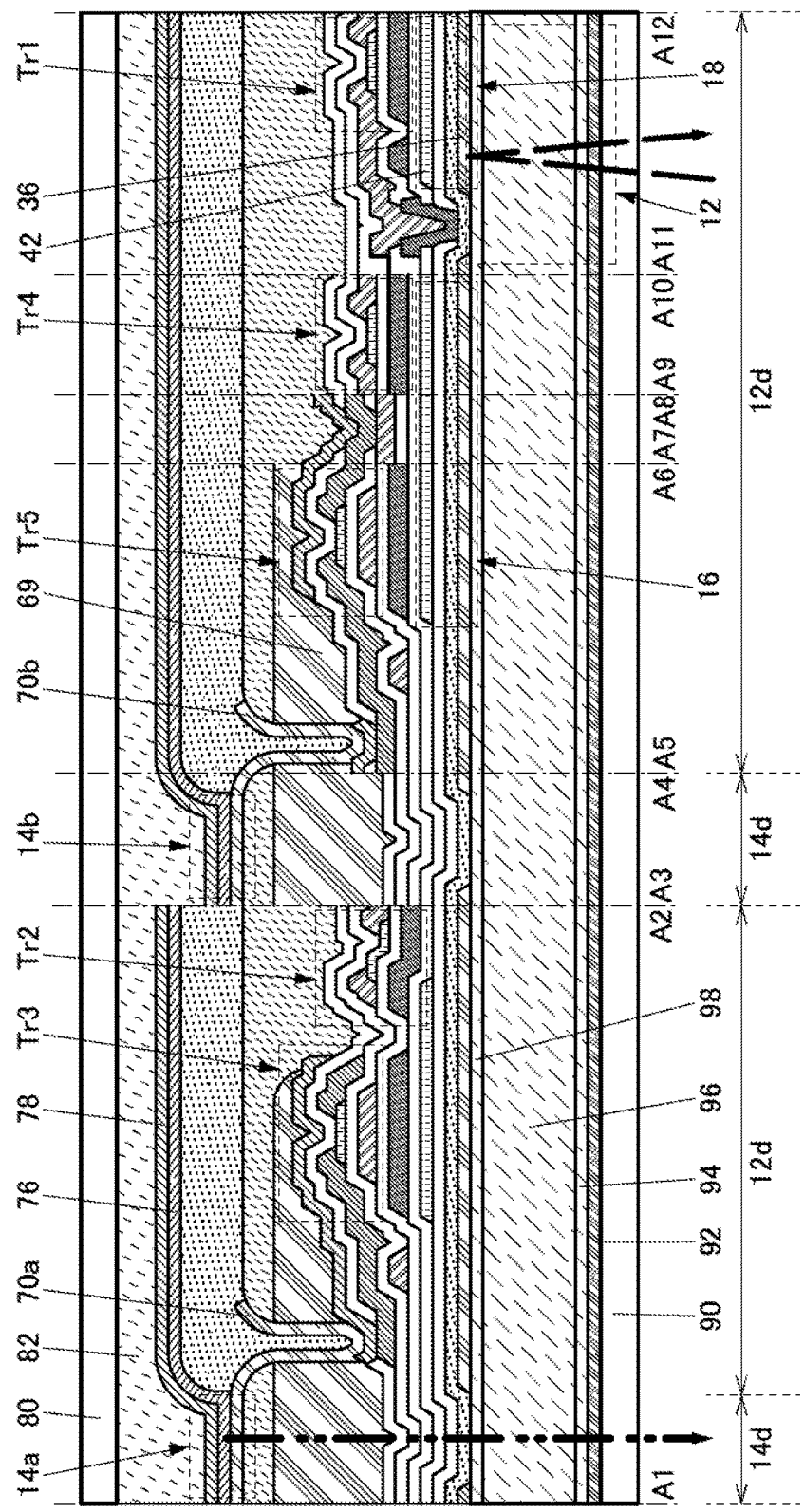
FIG. 6 is a cross-sectional view illustrating a structure of a pixel included in a display device.
Figure 7A:
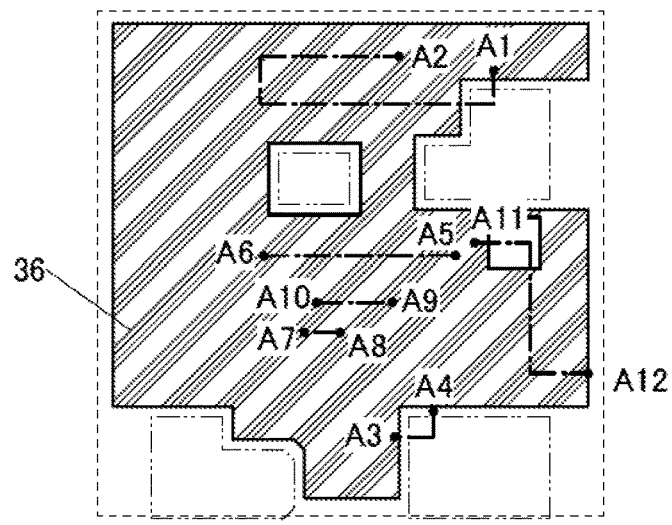
FIGS. 7A and 7B are top views illustrating a method for manufacturing a pixel included in a display device.
Figure 7B:
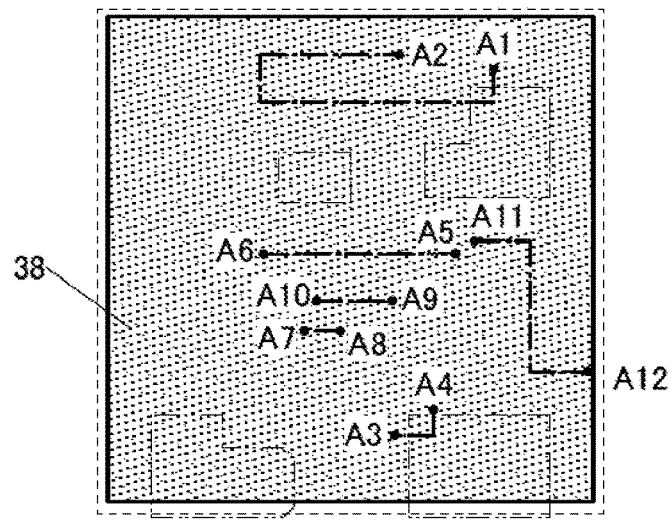
Figure 8A:
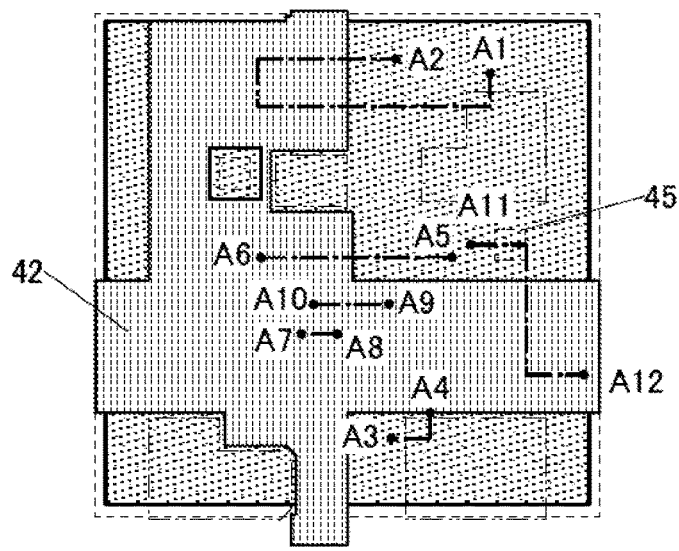
FIGS. 8A and 8B are top views illustrating a method for manufacturing a pixel included in a display device.
Figure 8B:
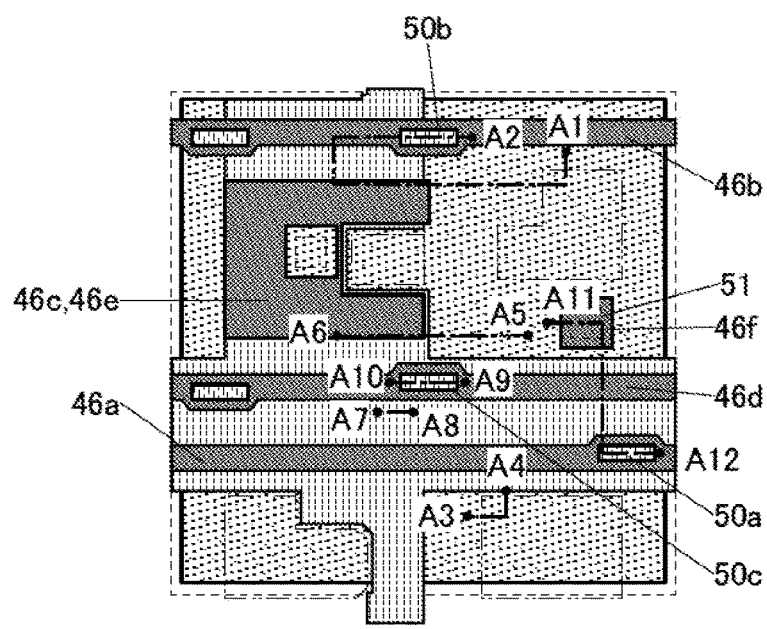

An example of the above structure is shown in FIG. 6. FIG. 6 is a cross-sectional view of a modification example of the pixel 10 in FIG. 5. As illustrated in FIG. 6, light from the display element 14a and the display element 14b is extracted to the outside through a coloring film 69. As illustrated in FIG. 6, the coloring film 69 is preferably provided to cover part of the transistor Tr3 and the transistor Tr5. In particular, when channel formation regions of the transistor Tr3 and the transistor Tr5 are covered with the coloring film 69, the amount of light which enters the channel formation regions can be reduced. Reducing the amount of light which enters the channel formation regions can increase light resistance of the transistor Tr3 and the transistor Tr5. The coloring film 69 may cover a transistor other than the transistor Tr3 and the transistor Tr5.

<1-9. Manufacturing Method of Display Device>

Next, a manufacturing method of the pixel 10 included in the display device 500 illustrated in FIG. 2 is described with reference to FIGS. 7A and 7B, FIGS. 8A and 8B, FIGS. 9A and 9B, FIGS. 10A and 10B, FIGS. 11A and 11B, FIGS. 12A and 12B, FIG. 13, FIG. 14, FIG. 15, FIG. 16, FIG. 17, FIG. 18, FIG. 19, FIG. 20, FIG. 21, FIG. 22, FIG. 23, and FIG. 24.

First, a conductive film 31, an insulating film 32, and an insulating film 34 are formed in this order over a substrate 30. Then, a conductive film is formed over the insulating film 34 and processed into an island shape, whereby the conductive film 36 is formed (see FIG. 7A and FIG. 13).

The conductive film 31 functions as a first separation layer. The insulating films 32 and 34 function as second separation layers. The conductive film 36 functions as a reflective film. Note that the conductive film 36 may be called the first pixel electrode. The first pixel electrode preferably contains one or both of silver and aluminum. The first pixel electrode containing silver and aluminum can increase its reflectance. Note that examples of the first pixel electrode containing silver include an alloy containing silver, palladium, and copper.

Next, a conductive film is formed over the insulating film 34 and the conductive film 36 and processed into an island shape, whereby a conductive film 38 is formed. Then, an insulating film 40 is formed over the conductive films 36 and 38 (see FIG. 7B and FIG. 14).

The conductive film 36 functions as part of one of the pair of electrodes of the display element 12. Note that the conductive film 36 has the following function. The conductive film 36 has a function of controlling the alignment of the liquid crystal layer 96 included in the display element 12.

The conductive film 38 is electrically connected to the conductive film 36. The conductive film 38 is formed using a light-transmitting conductive material.

Next, a conductive film is formed over the insulating film 40 and processed into an island shape, whereby the conductive film 42 is formed. Then, an insulating film 44 is formed over the conductive film 42. Then, a first opening 45 is formed in desired regions of the insulating films 40 and 44. Note that the first opening 45 is formed so as to expose part of the conductive film 38 (see FIG. 8A and FIG. 15).

Next, a conductive film is formed over the insulating film 44 and processed into an island shape, whereby conductive films 46a, 46b, 46c, 46d, 46e, and 46f are formed. Then, an insulating film 48 is formed over the insulating film 44 and the conductive films 46a, 46b, 46c, 46d, 46e, and 46f. Then, an oxide semiconductor film is formed over the insulating film 48 and processed into an island shape, whereby oxide semiconductor films 50a, 50b, and 50c are formed. Then, a second opening 51 is formed in a desired region of the insulating film 48. Note that the second opening 51 is formed to overlap with the first opening 45 and to expose part of the conductive film 46f (see FIG. 8B and FIG. 16).

The conductive film 42 functions as the other of the pair of electrodes of the capacitor 16. That is, the capacitor 16 includes the conductive film 36, the conductive film 38, the insulating film 40, and the conductive film 42. The conductive films 36 and 38 function as one of the pair of electrodes of the capacitor 16. The conductive film 42 functions as the other of the pair of electrodes of the capacitor 16. The insulating film 40 functions as a dielectric film of the capacitor 16.

The conductive film 46a functions as the gate electrode of the transistor Tr1. The conductive film 46b functions as the gate electrode of the transistor Tr2. The conductive film 46d functions as a gate electrode of the transistor Tr4.

Figure 9A:
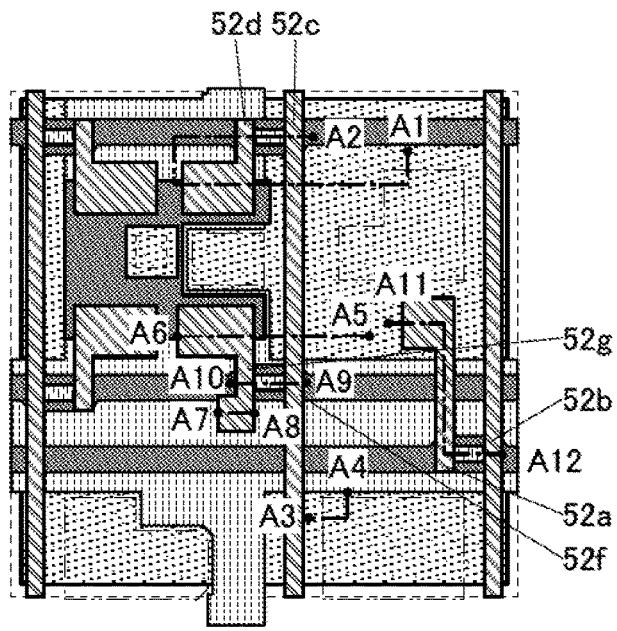
FIGS. 9A and 9B are top views illustrating a method for manufacturing a pixel included in a display device.
Figure 9B:
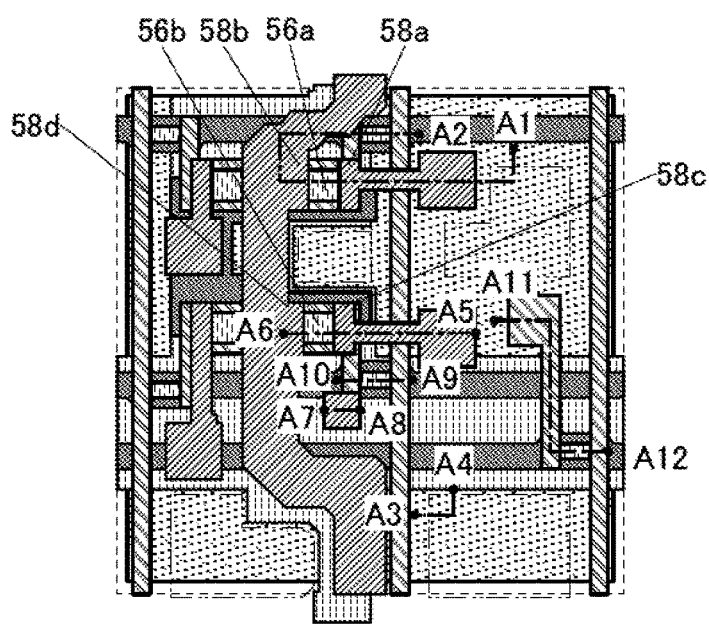
Figure 17:
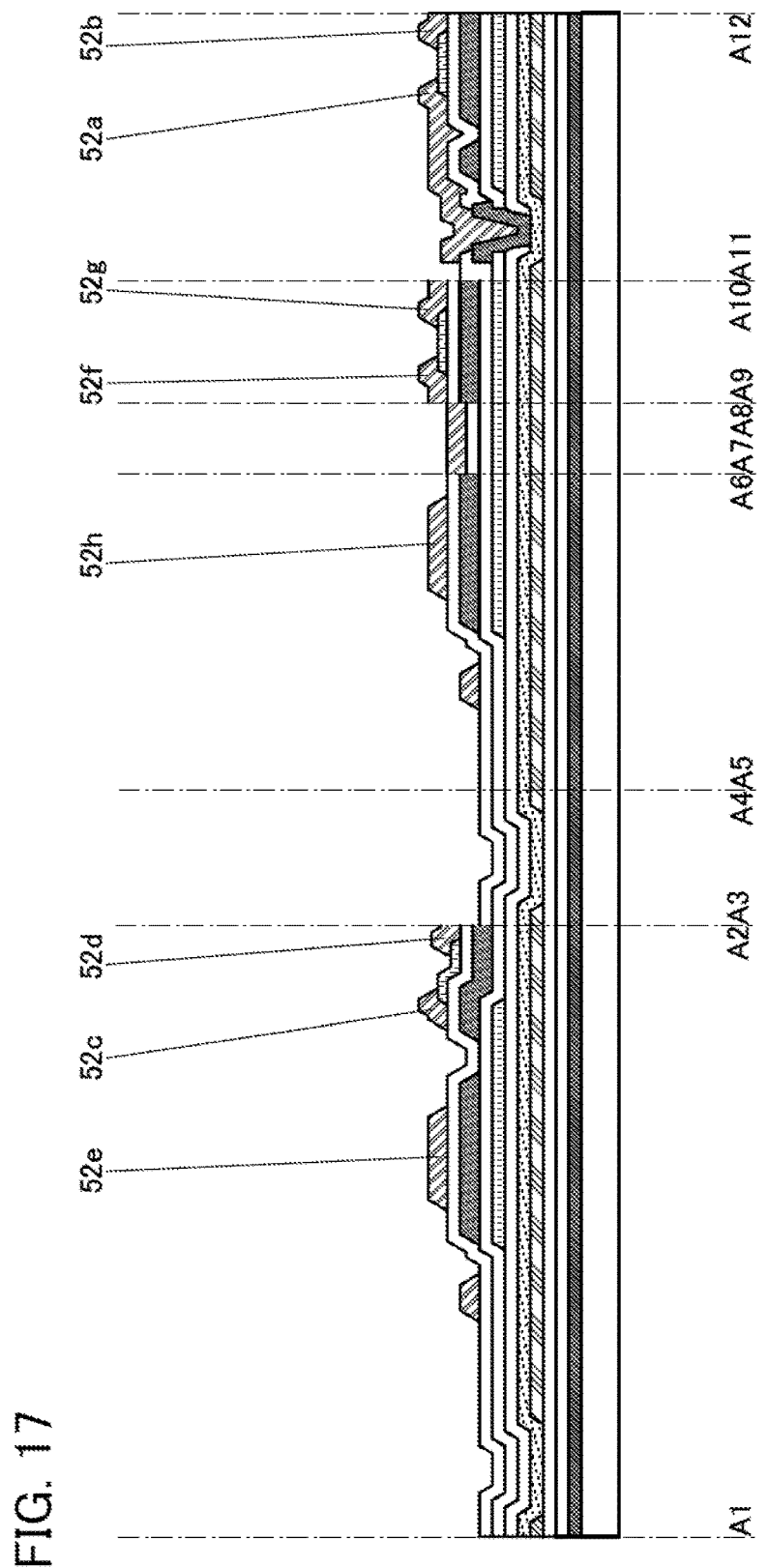
FIG. 17 is a cross-sectional view illustrating a method for manufacturing a pixel included in a display device.
Figure 18:
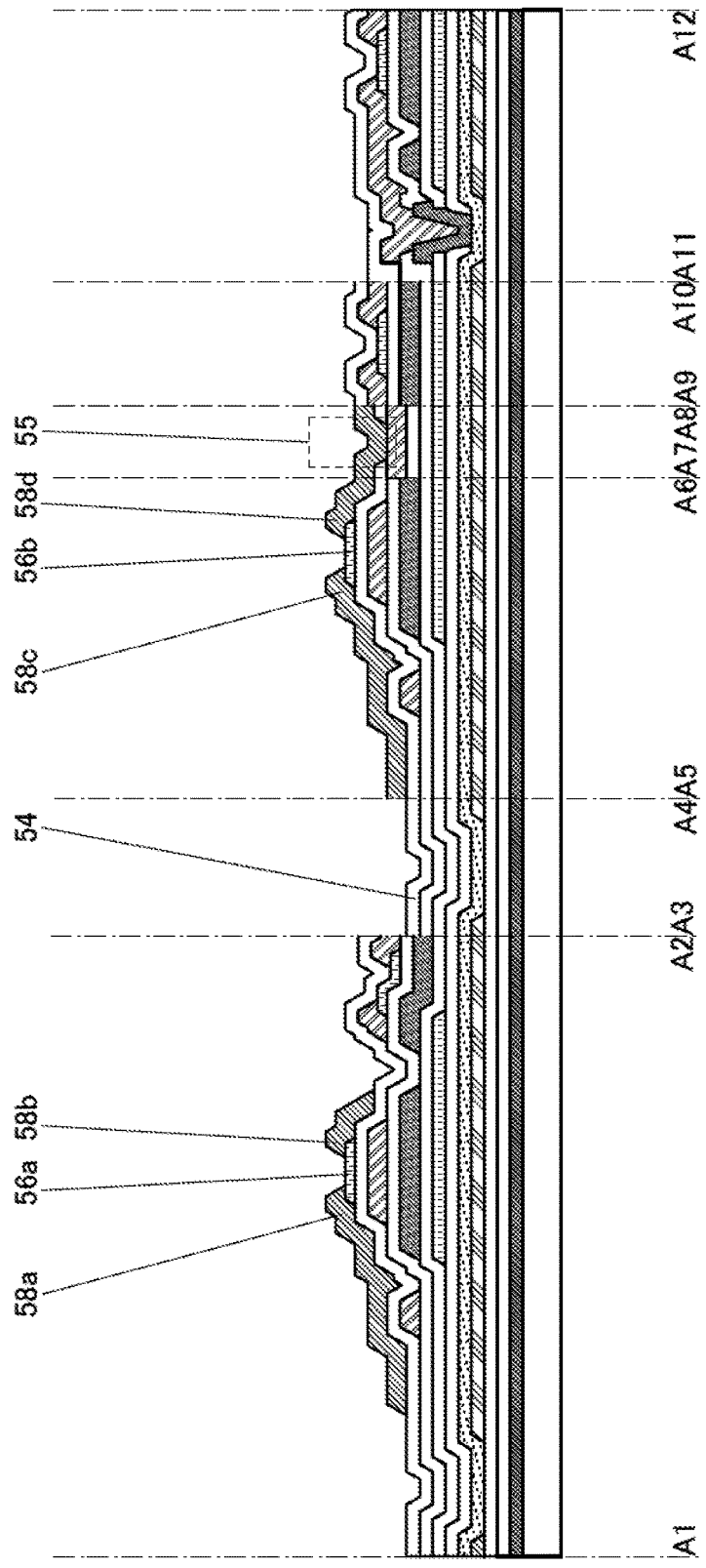
FIG. 18 is a cross-sectional view illustrating a method for manufacturing a pixel included in a display device.
Figure 19:
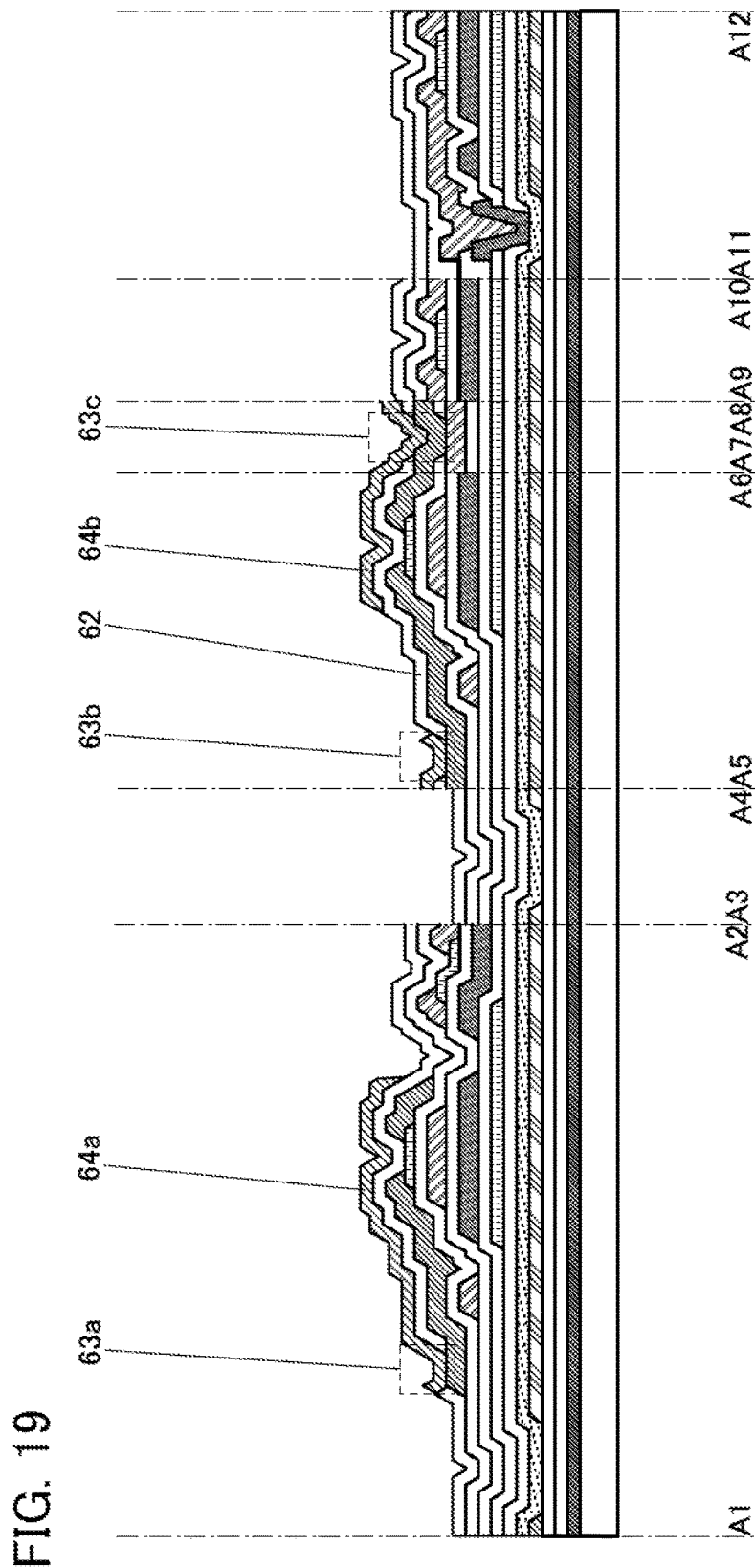
FIG. 19 is a cross-sectional view illustrating a method for manufacturing a pixel included in a display device.
Figure 20:
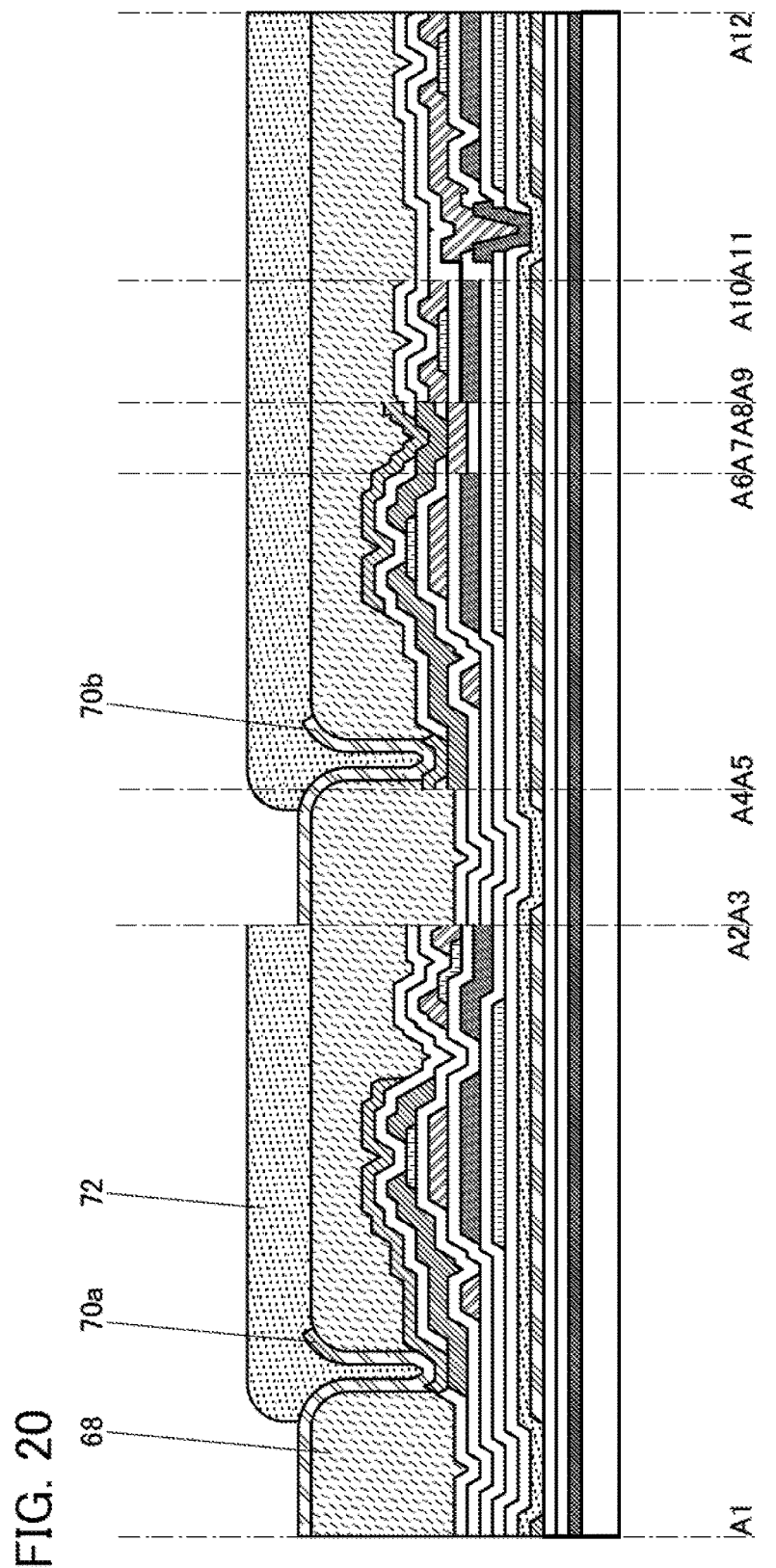
FIG. 20 is a cross-sectional view illustrating a method for manufacturing a pixel included in a display device.

Next, a conductive film is formed over the insulating film 48, the oxide semiconductor film 50a, the oxide semiconductor film 50b, and the second opening 51 and processed into island shapes, whereby conductive films 52a, 52b, 52c, 52d, 52e, 52f, 52g, and 52h are formed (see FIG. 9A and FIG. 17).

The conductive films 52a and 52b function as a source electrode and a drain electrode of the transistor Tr1. The conductive films 52c and 52d function as a source electrode and a drain electrode of the transistor Tr2. The conductive films 52f and 52g function as a source electrode and a drain electrode of the transistor Tr4.

The conductive film 52e functions as a gate electrode of the transistor Tr3. The conductive film 52h functions as a gate electrode of the transistor Tr5.

Next, an insulating film 54 is formed over the insulating film 48, the oxide semiconductor films 50a and 50b, and the conductive films 52a, 52b, 52c, 52d, and 52e. Then, an oxide semiconductor film is formed over the insulating film 54 and processed, whereby island-shaped oxide semiconductor films 56a and 56b are formed. Then, a third opening 55 is formed in a desired region of the insulating film 54. Note that the third opening 55 is formed to expose part of the conductive film 52. Then, a conductive film is formed over the island-shaped oxide semiconductor films 56a and 56b to cover the third opening 55, and processed into island shapes, whereby conductive films 58a, 58b, 58c, and 58d are formed (see FIG. 9B and FIG. 18).

The conductive films 58a and 58b function as a source electrode and a drain electrode of the transistor Tr3. The conductive films 58c and 58d function as a source electrode and a drain electrode of the transistor Tr5.

Next, an insulating film 62 is formed over the insulating film 54 and the conductive films 58a and 58b. Then, a fourth opening 63a reaching the conductive film 58a, a fifth opening 63b reaching the conductive film 58c, and a sixth opening 63c reaching the conductive film 58d are formed in desired regions of the insulating film 62. Note that the sixth opening 63c is formed to overlap with the third opening 55. The fourth opening 63a, the fifth opening 63b, and the sixth opening 63c are each formed to expose part of the conductive film 58a, part of the conductive film 58c, and part of the conductive film 58d, respectively. Then, a conductive film is formed over the insulating film 62 to cover the fourth opening 63a, the fifth opening 63b, and the sixth opening 63c, and the conductive film is processed into island shapes, whereby conductive films 64a and 64b are formed (see FIG. 10A and FIG. 19).

The conductive film 64a functions as a back gate electrode of the transistor Tr3. The conductive film 64a is electrically connected to the conductive film 58a. The conductive film 64b functions as a back gate electrode of the transistor Tr5. The conductive film 64b is electrically connected to the conductive film 58d. With this structure, the back gate electrode of the transistor Tr3 is electrically connected to one of the source electrode and the drain electrode of the transistor Tr3, so that the potential of the back channel side of the transistor can be fixed. The back gate electrode of the transistor Tr5 is electrically connected to the front gate electrode of the transistor Tr5, so that the current drive capability of the transistor can be improved.

Next, an insulating film 68 having openings is formed over the insulating film 62 and the conductive films 64a and 64b. Next, a conductive film is formed over the insulating film 68 and processed into island shapes, whereby the conductive films 70a and 70b are formed. Then, an insulating film 72 having openings is formed over the insulating film 68 and the conductive films 70a and 70b (see FIG. 10B and FIG. 20).

Figure 10A:
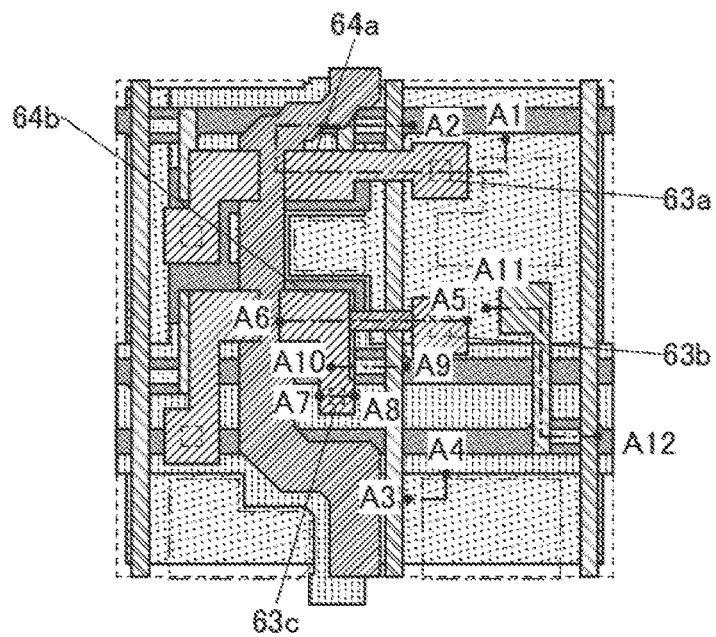
FIGS. 10A and 10B are top views illustrating a method for manufacturing a pixel included in a display device.
Figure 10B:
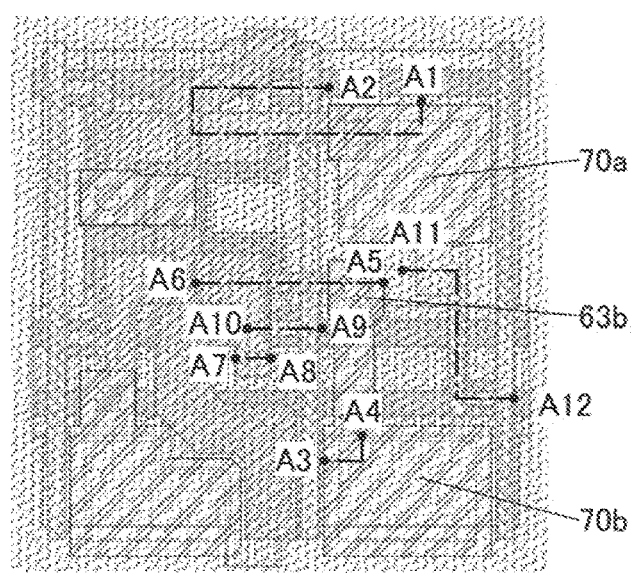

The insulating film 68 functions as a planarization insulating film. The conductive film 70a functions as one of a pair of electrodes of the display element 14a and a second pixel electrode. The conductive film 70b functions as one of a pair of electrodes of the display element 14b and the second pixel electrode. Note that the conductive film 70a is electrically connected to the conductive film 58a and the conductive film 64a. The conductive film 70b is electrically connected to the conductive film 58d and the conductive film 64b. The conductive films 70a and 70b functioning as the second pixel electrode preferably contain one or more elements selected from indium, zinc, tin, and silicon. For example, as the conductive films 70a and 70b, conductive films containing indium, tin, and silicon can be used. In FIG. 10B, hatchings of the conductive films 70a and 70b are illustrated transparently so that components under the conductive films 70a and 70b are clearly shown.

Figure 11A:
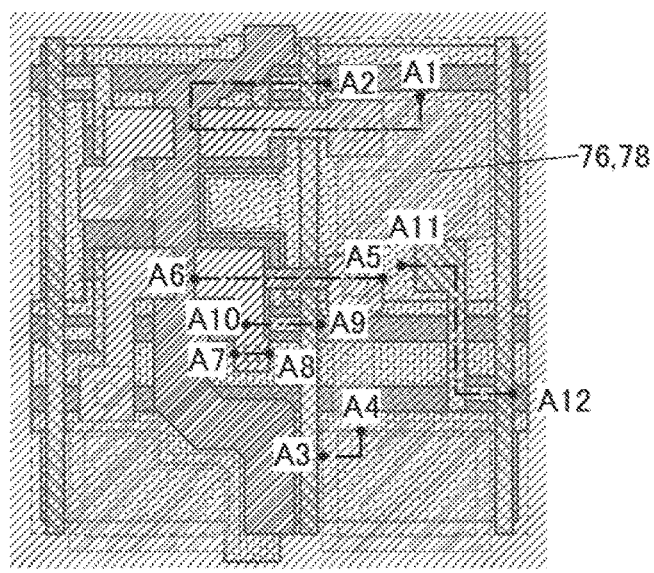
FIGS. 11A and 11B are top views illustrating a method for manufacturing a pixel included in a display device.
Figure 21:
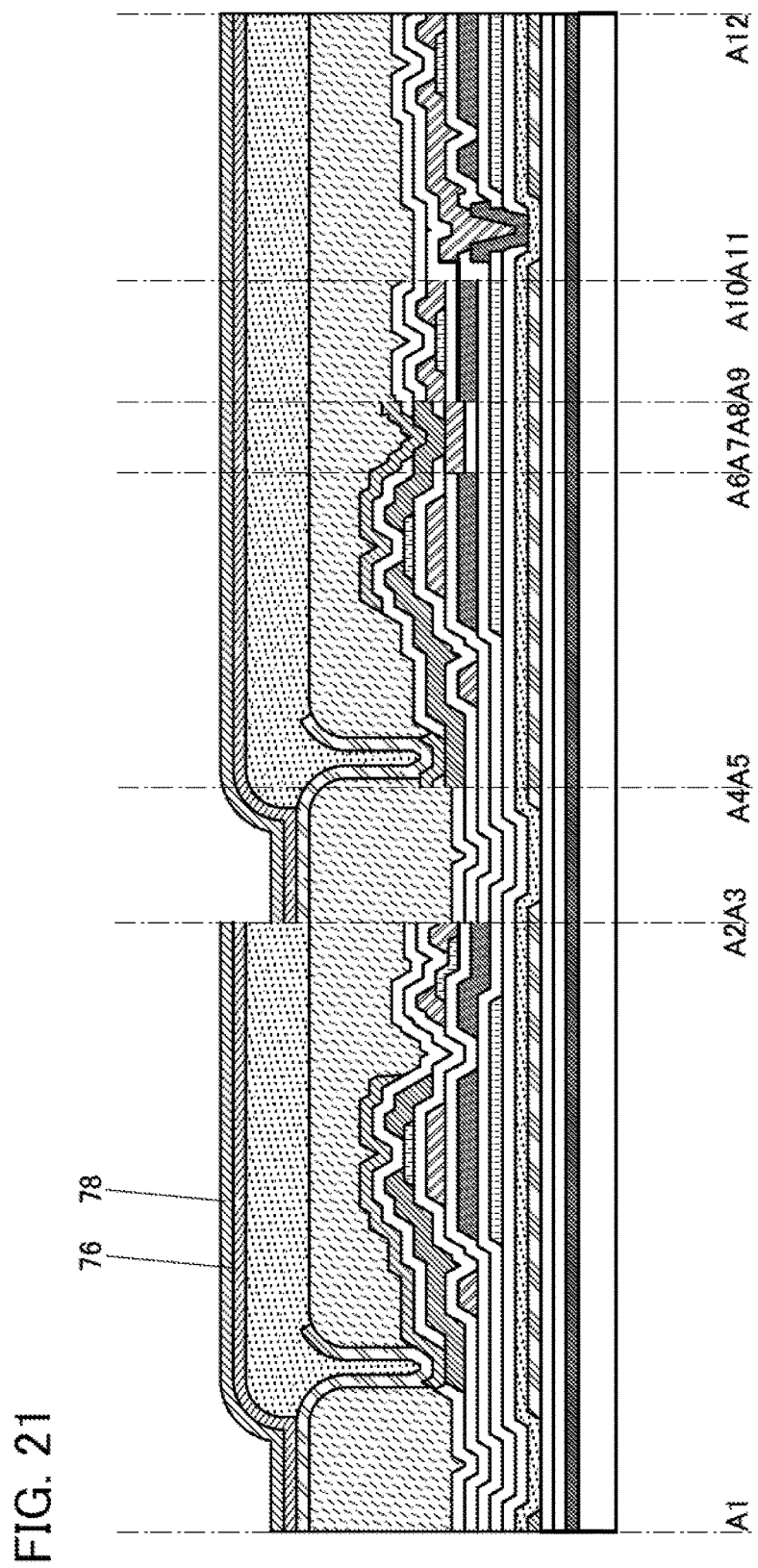
FIG. 21 is a cross-sectional view illustrating a method for manufacturing a pixel included in a display device.

Next, the EL layer 76 and the conductive film 78 are formed over the insulating film 72 (see FIG. 11A and FIG. 21). In FIG. 11A, hatchings of the conductive films 70a and 70b, the EL layer 76, and the conductive film 78 are illustrated transparently so that components under the conductive films 70a and 70b are clearly shown.

Note that a structure body in an island shape may be provided between the insulating film 72 and the EL layer 76. The structure body has a function of controlling the distance between the display element 14 and the substrate 80. The EL layer 76 has a function of emitting light. The conductive film 78 functions as the other of the pair of electrodes of the display element 14.

Figure 11B:
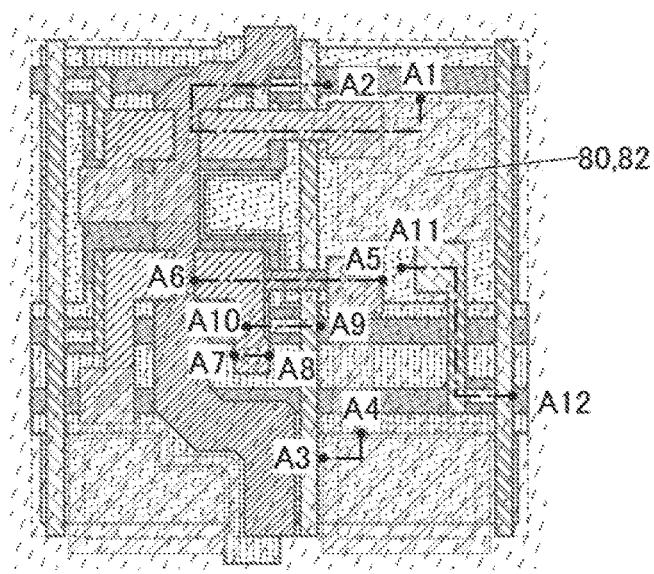
Figure 22:
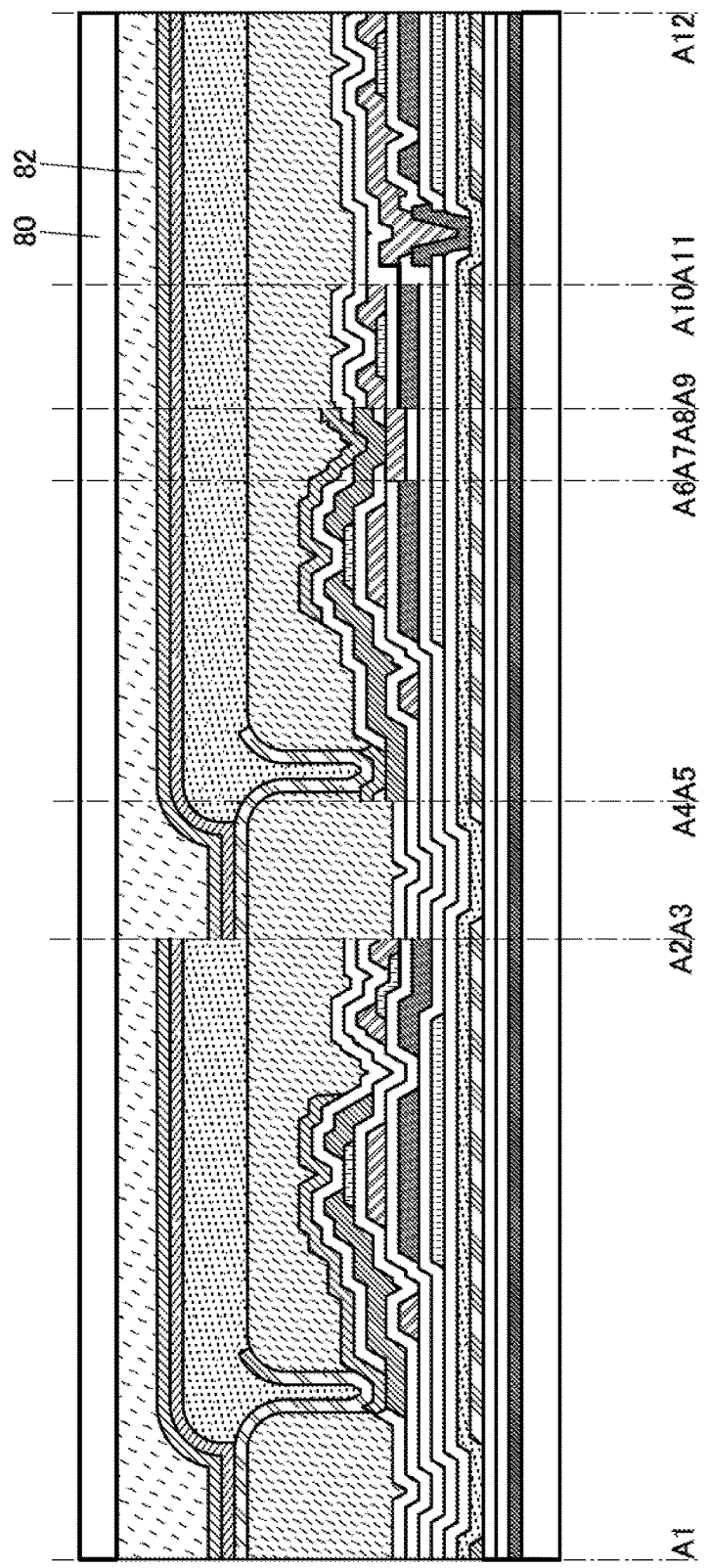
FIG. 22 is a cross-sectional view illustrating a method for manufacturing a pixel included in a display device.
Figure 23:
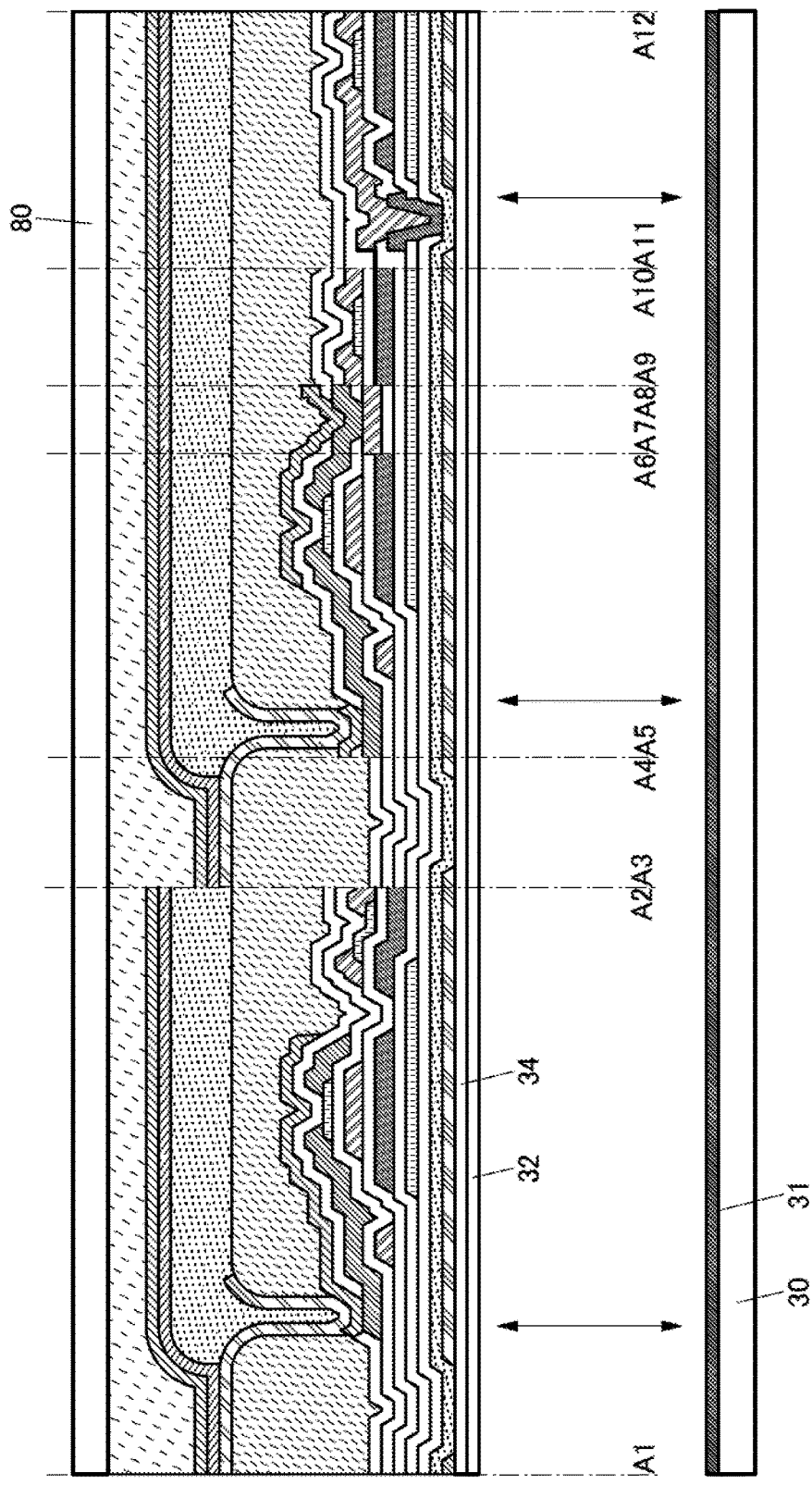
FIG. 23 is a cross-sectional view illustrating a method for manufacturing a pixel included in a display device.

Then, a sealing material 82 is applied on the conductive film 78, and the substrate 30 on which the transistor, the display element, and the like are formed and the substrate 80 are bonded to each other (see FIG. 11B and FIG. 22). In FIG. 11B, hatchings of the conductive films 70a and 70b, the EL layer 76, the conductive film 78, and the sealing material 82 are illustrated transparently so that components under the conductive films 70a and 70b are clearly shown.

Figure 12A:
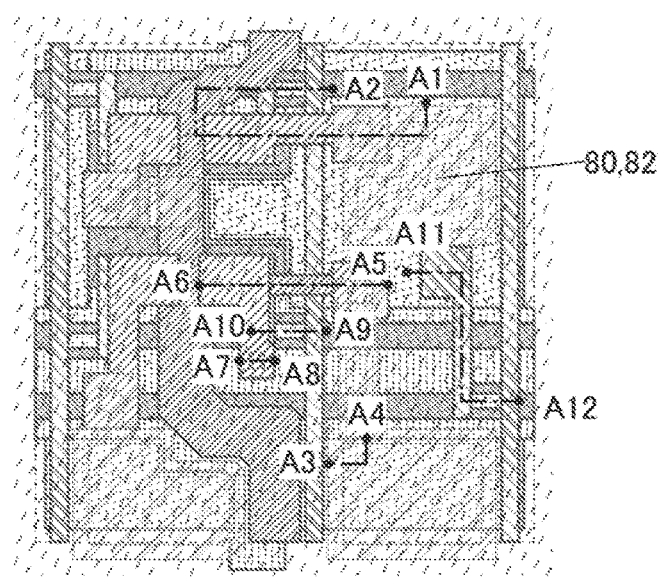
FIGS. 12A and 12B are top views illustrating a method for manufacturing a pixel included in a display device.

Then, the substrate 30 and the substrate 80 are separated from each other. In this embodiment, the substrate 30 and the substrate 80 are separated from each other at the vicinity of an interface between the conductive film 31 and the insulating film 32 (see FIG. 12A and FIG. 23). In FIG. 12A, hatchings of the conductive films 70a and 70b, the EL layer 76, the conductive film 78, and the sealing material 82 are illustrated transparently so that components under the conductive films 70a and 70b are clearly shown.

When an element is separated at the interface between the element and the conductive film 31, a polar solvent (typically water), a nonpolar solvent, or the like is preferably added to the interface between the conductive film 31 and the insulating film 32. For example, it is preferable to use water in separating the element at the interface between the element and the conductive film 31 because damage caused by electrification in separation can be reduced.

As the conductive film 31, any of the following materials can be used. The conductive film 31 can have a single-layer structure or a stacked-layer structure containing an element selected from tungsten, molybdenum, titanium, tantalum, zinc, ruthenium, rhodium, palladium, osmium, iridium, gallium, and silicon; an alloy material containing any of the elements; or a compound material containing any of the elements. In the case of a layer containing silicon, a crystal structure of the layer containing silicon may be amorphous, microcrystal, polycrystal, or single crystal.

When the conductive film 31 is formed as a stacked-layer structure including a layer containing tungsten and a layer containing an oxide of tungsten, the layer containing tungsten may be formed and an insulating layer containing an oxide may be formed thereover so that the layer containing an oxide of tungsten is formed at the interface between the tungsten layer and the insulating layer. Alternatively, the layer containing an oxide of tungsten may be formed by performing thermal oxidation treatment, oxygen plasma treatment, dinitrogen monoxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or dinitrogen monoxide alone, or a mixed gas of any of these gasses and another gas. Surface condition of the conductive film 31 is changed by the plasma treatment or heat treatment, whereby adhesion between the conductive film 31 and the insulating film 32 formed later can be controlled.

Although the structure where the conductive film 31 is provided is described in this embodiment, the present invention is not limited thereto. For example, a structure where the conductive film 31 is not provided may be employed. In that case, an organic resin film may be formed in a region in which the conductive film 31 is formed. As the organic resin film, for example, a polyimide-based resin film, a polyamide-based resin film, an acrylic-based resin film, an epoxy-based resin film, or a phenol-based resin film can be used. Note that in the case where a polyimide-based resin film is used, a photosensitive and thermosetting organic resin material is preferably used. When a photosensitive and thermosetting organic resin material is used, the organic resin material can have a shape or the like.

In the case where the organic resin film is used instead of the conductive film 31, as a method for separating the element formed over the substrate 30, laser light (e.g., excimer laser having a wavelength of 308 nm or UV laser having a wavelength of 355 nm which is the third harmonic of a YAG laser) is irradiated from the lower side of the substrate 30 to weaken the organic resin film, whereby separation is conducted at an interface between the substrate 30 and the organic resin film, inside the organic resin film, or at an interface between the organic resin film and the insulating film 32.

In the case where irradiation with the laser light is performed, a region having strong adhesion and a region having weak adhesion are formed between the substrate 30 and the insulating film 32 by adjustment of the irradiation energy density of the laser light, and then, the element may be separated from the substrate 30. As the laser light, linear laser light may be used.

Figure 12B:
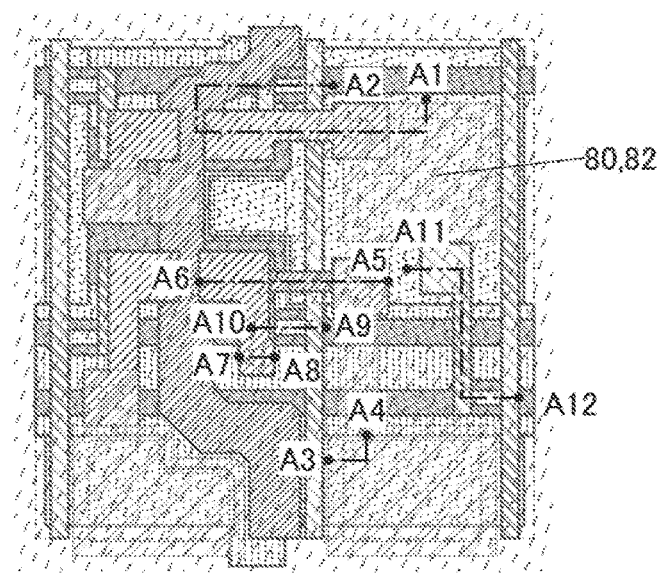
Figure 13:
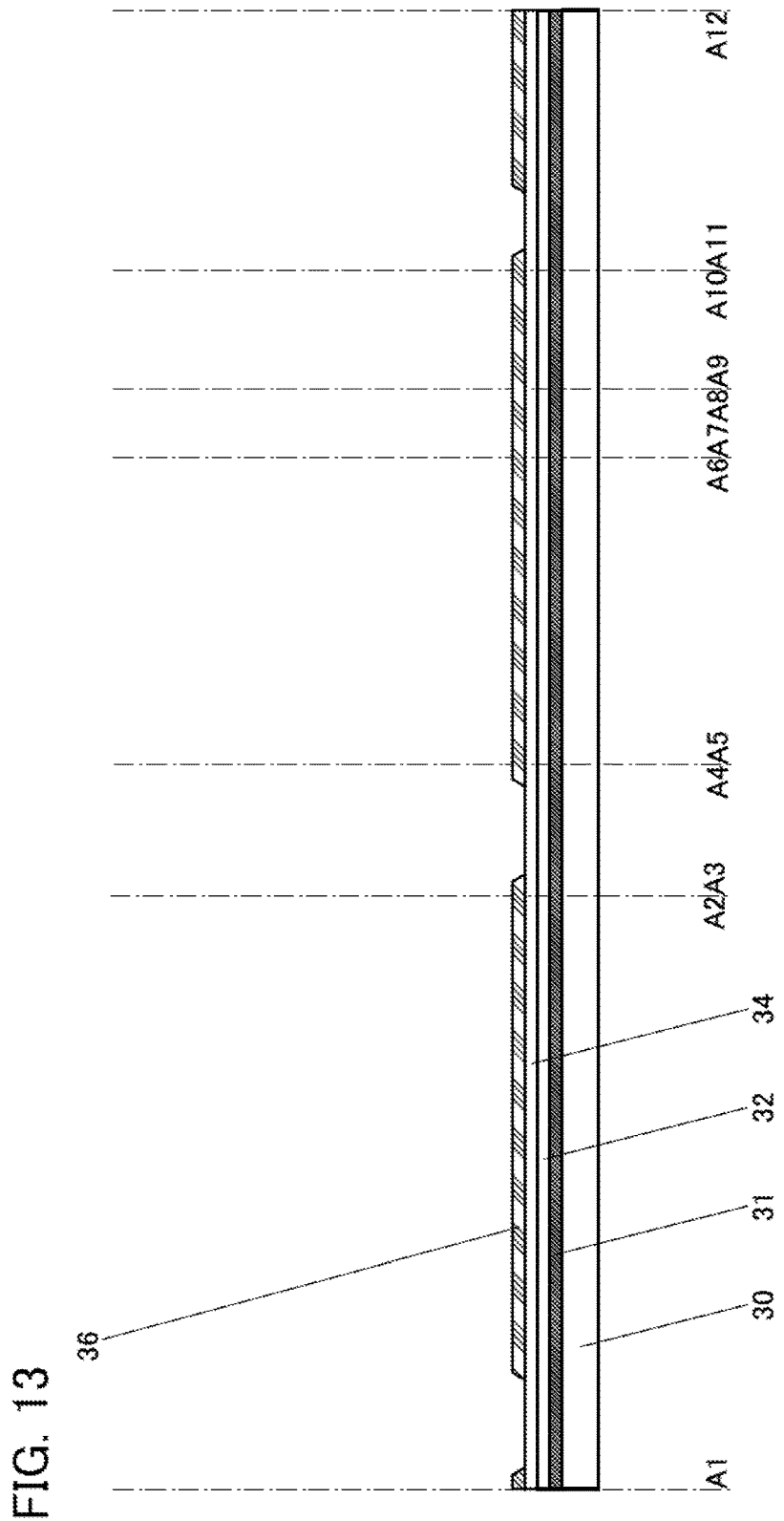
FIG. 13 is a cross-sectional view illustrating a method for manufacturing a pixel included in a display device.
Figure 14:
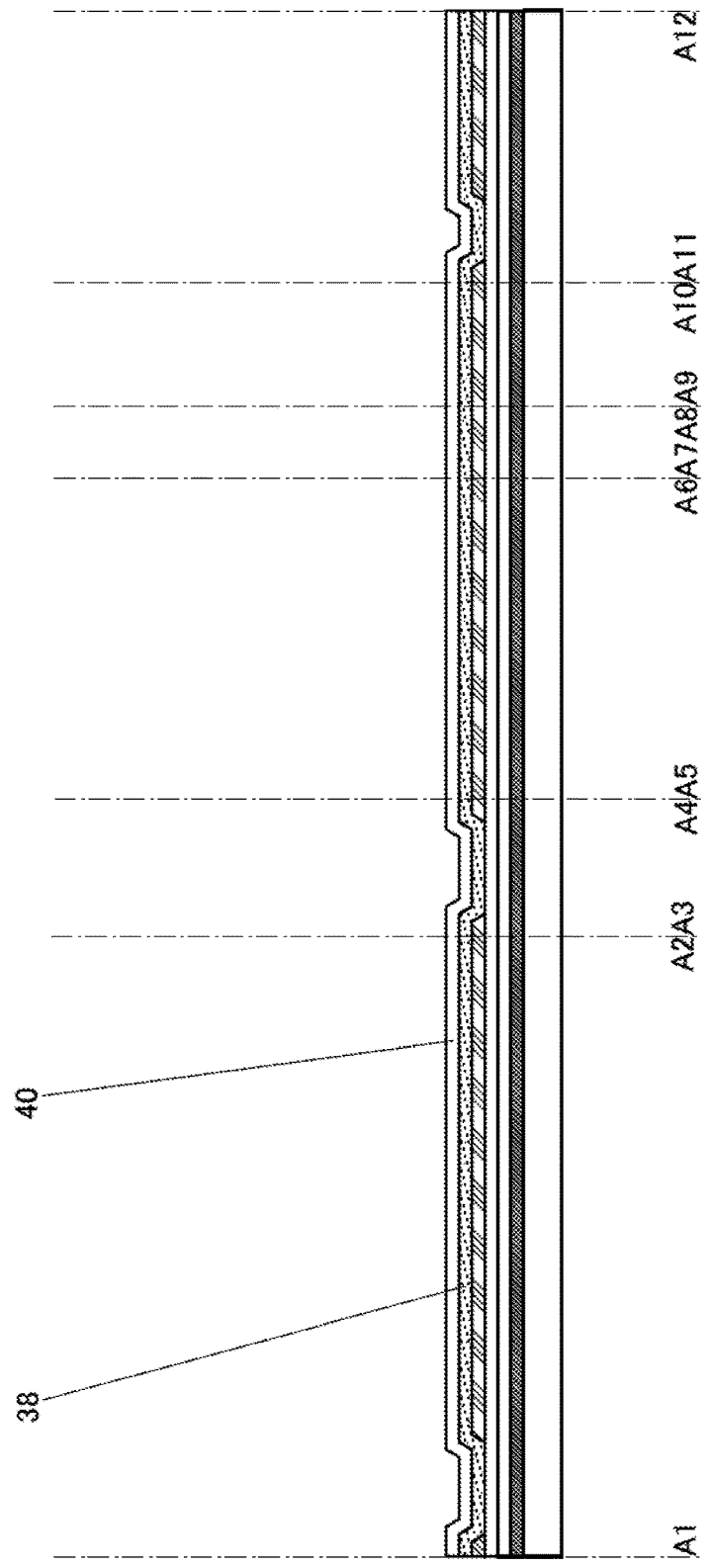
FIG. 14 is a cross-sectional view illustrating a method for manufacturing a pixel included in a display device.
Figure 15:
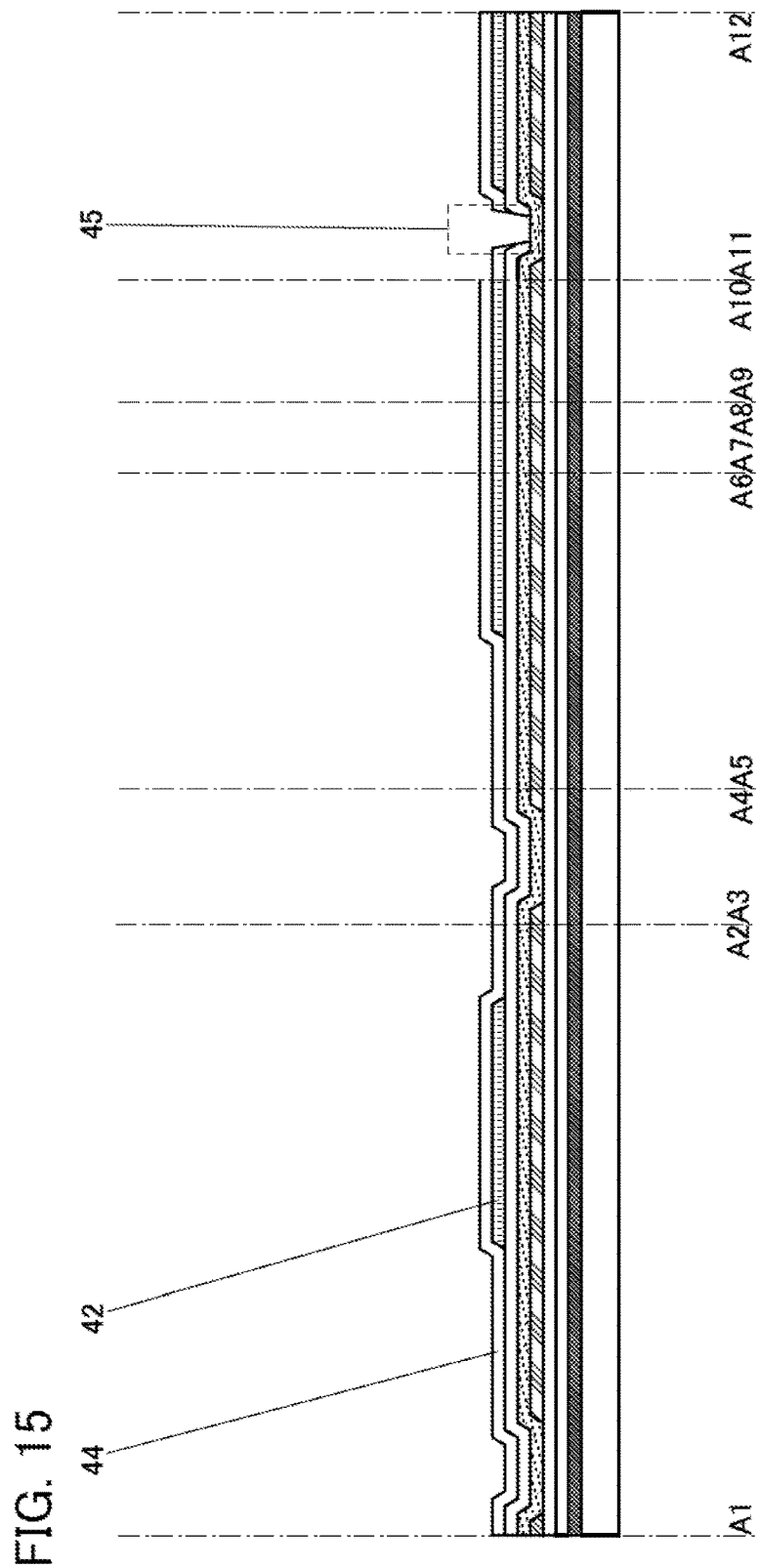
FIG. 15 is a cross-sectional view illustrating a method for manufacturing a pixel included in a display device.
Figure 16:
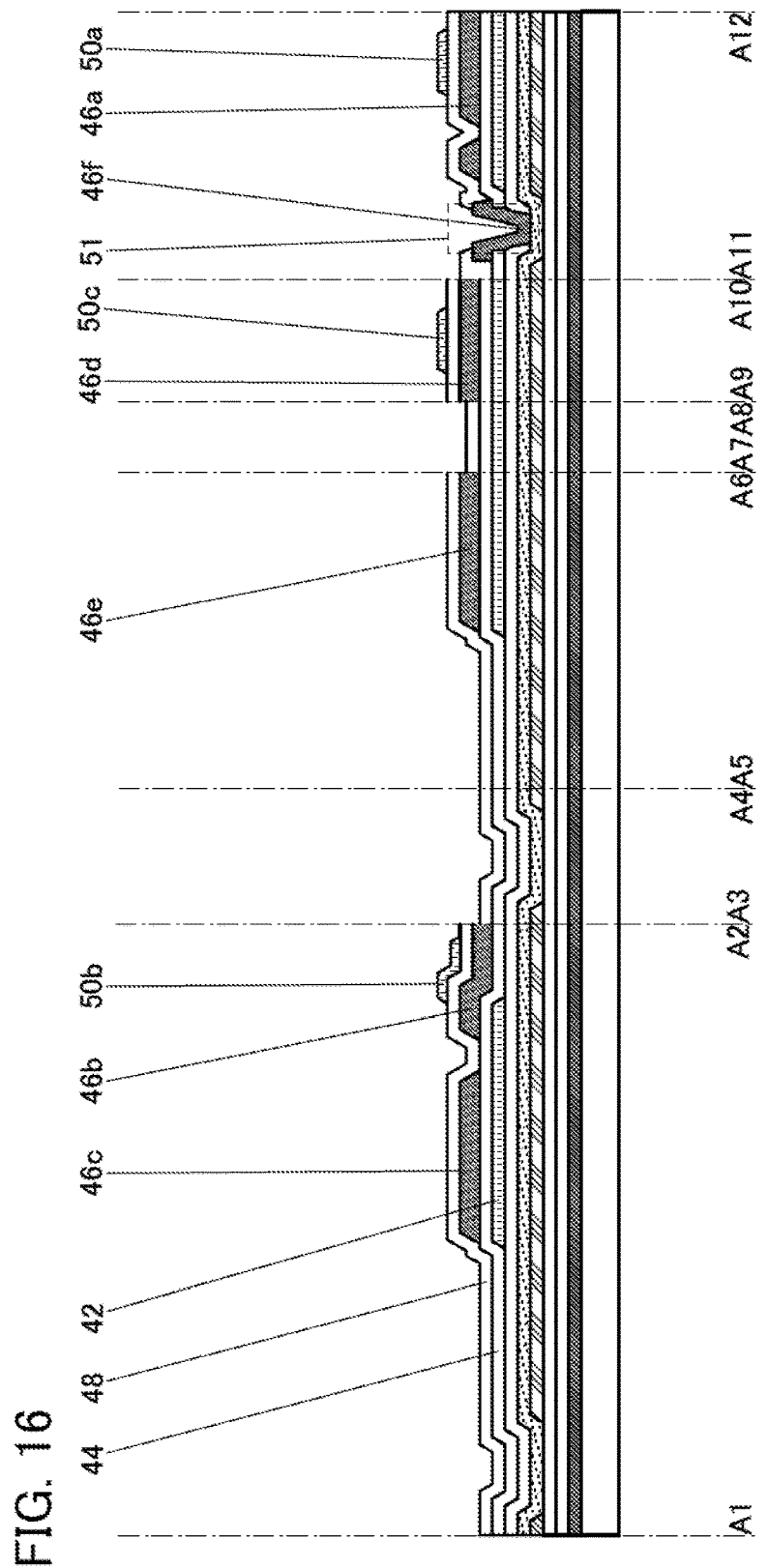
FIG. 16 is a cross-sectional view illustrating a method for manufacturing a pixel included in a display device.
Figure 24:
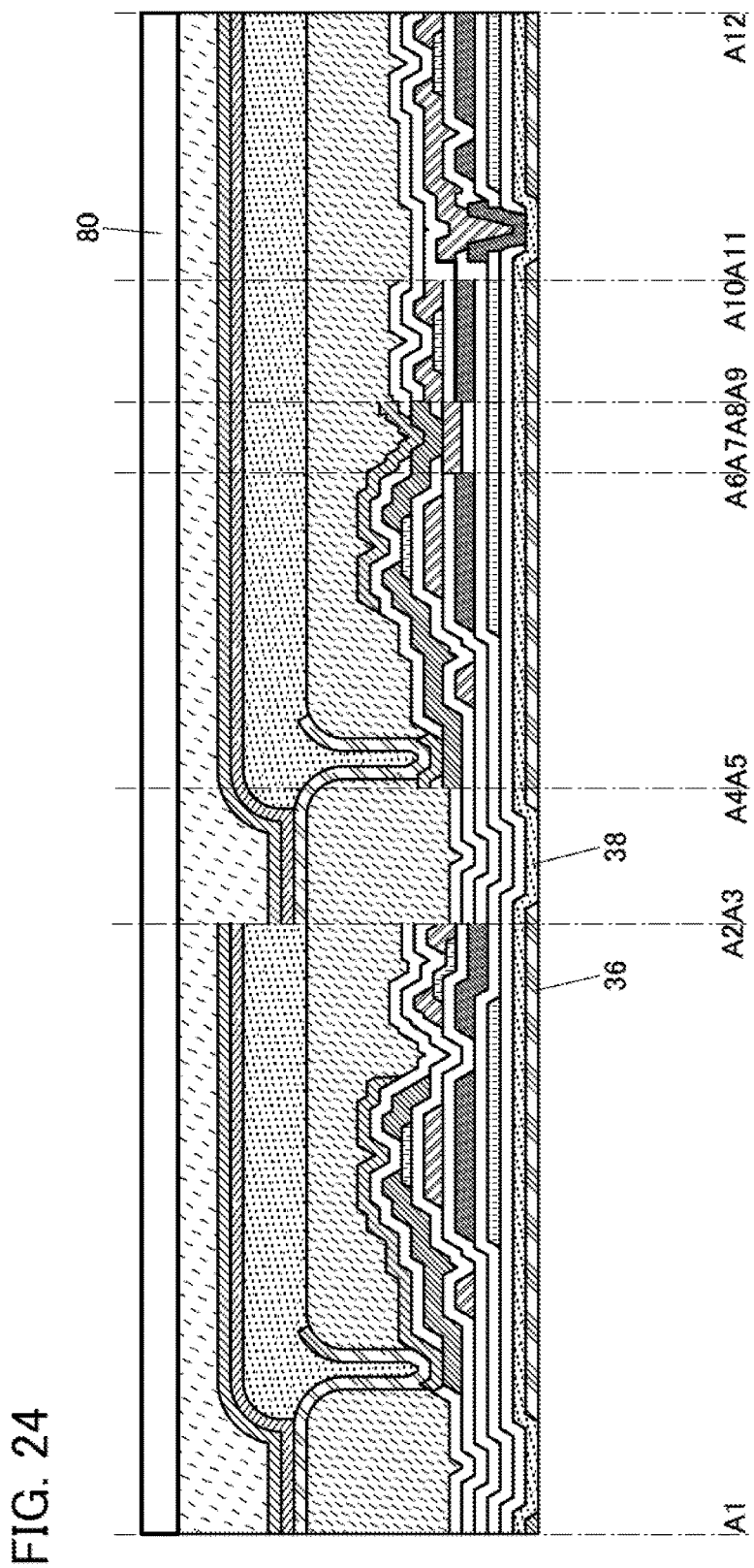
FIG. 24 is a cross-sectional view illustrating a method for manufacturing a pixel included in a display device.

Next, the insulating films 32 and 34 formed below the substrate 80 are removed, and rear surfaces of the conductive films 36 and 38 are exposed (see FIG. 12B and FIG. 24). In FIG. 12B, hatchings of the conductive films 70*a* and 70*b*, the EL layer 76, the conductive film 78, and the sealing material 82 are illustrated transparently so that components under the conductive films 70*a* and 70*b* are clearly shown.

As a method of removing the insulating films 32 and 34, one or both of a dry etching method and a wet etching method can be used.

Next, the alignment film 98 is formed in contact with the conductive films 36 and 38. Then, the substrate 90 over which the conductive film 92 and the alignment film 94 are formed is prepared, and a space between a side of the substrate 80 over which the alignment film 98 is formed and a side of the substrate 90 over which the alignment film 94 is formed is filled with the liquid crystal layer 96, whereby the display device 500 including the pixel 10 shown in FIG. 4 and FIG. 5 can be manufactured.

<1-10. Components of Display Device>

Next, the components of the display device 500 and the manufacturing method thereof illustrated in FIGS. 1A and 1B, FIG. 2, FIG. 3, FIG. 4, FIG. 5, FIG. 6, FIGS. 7A and 7B, FIGS. 8A and 8B, FIGS. 9A and 9B, FIGS. 10A and 10B, FIGS. 11A and 11B, FIGS. 12A and 12B, FIG. 13, FIG. 14, FIG. 15, FIG. 16, FIG. 17, FIG. 18, FIG. 19, FIG. 20, FIG. 21, FIG. 22, FIG. 23, and FIG. 24 are described below.

[Substrate]

The substrates 30, 80, and 90 can be formed using a material having heat resistance high enough to withstand heat treatment in the manufacturing process.

Specifically, non-alkali glass, soda-lime glass, alkali glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass may have a thickness of greater than or equal to 0.2 mm and less than or equal to 0.7 mm, for example. The non-alkali glass may be polished to obtain the above thickness.

As the non-alkali glass, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, for the substrates 30, 80, and 90, a single-crystal semiconductor substrate or a polycrystalline semiconductor substrate made of silicon or silicon carbide, a compound semiconductor substrate made of silicon germanium or the like, an SOI substrate, or the like may be used.

For the substrates 30, 80, and 90, an inorganic material such as a metal may be used. Examples of the inorganic material such as a metal include stainless steel and aluminum.

Alternatively, for the substrates 30, 80, and 90, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

For the substrates 30, 80, and 90, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

The substrates 30, 80, and 90 can at least support films or layers formed thereover or thereunder and may be one or more of an insulating film, a semiconductor film, and a conductive film.

[Conductive Film]

As the conductive films 31, 36, 38, 42, 46*a*, 46*b*, 46*c*, 52*a*, 52*b*, 52*c*, 52*d*, 52*e*, 58*a*, 58*b*, 64*a*, 64*b*, 70*a*, 70*b*, 78, and 92, a metal film having conductivity, a conductive film having a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, or a three-layer structure in which a titanium film, a copper film, and a titanium film are stacked in this order may be used. In particular, a conductive film containing a copper element is preferably used because the resistance can be reduced. As an example of the conductive film containing a copper element, an alloy film containing copper and manganese is given. The alloy film is preferable because it can be processed by a wet etching method.

As the metal film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 31, 36, 38, 42, 46a, 46b, 46c, 52a, 52b, 52c, 52d, 52e, 58a, 58b, 64a, 64b, 70a, 70b, 78, and 92 can be formed by electroless plating. As materials that can be formed by electroless plating, for example, one or more selected from Cu, Ni, Al, Au, Sn, Co, Ag, and Pd can be used. It is further favorable to use Cu or Ag because the resistance of the conductive film can be reduced.

When the conductive film is formed by electroless plating, a diffusion prevention film may be formed under the conductive film to prevent component elements of the conductive film from diffusing outward. A seed film that can make the conductive film grow may be formed between the diffusion prevention film and the conductive film. The diffusion prevention film can be formed by sputtering, for example. For the diffusion prevention film, a tantalum nitride film or a titanium nitride film can be used, for example. The seed film can be formed by electroless plating. For the seed film, a material similar to the material for the conductive film that can be formed by electroless plating can be used.

Alternatively, a conductive film having functions of reflecting visible light and transmitting visible light may be formed by combining the conductive film having the function of reflecting visible light and the conductive film having the function of transmitting visible light. For example, a structure in which one of the pair of electrodes included in the display element 14 is a conductive film having a function of reflecting visible light and the other of the pair of electrodes is a conductive film having functions of reflecting visible light and transmitting visible light can be given. The above structure can be a micro optical resonator (microcavity) structure utilizing a resonant effect of light between a pair of electrodes, so that the intensity of light having a specific wavelength can be increased.

Note that the other of the pair of electrodes included in the display element 14 (e.g., the conductive films 70a and 70b) can have a stacked-layer structure including an In—Sn—Si oxide and an alloy containing silver. The alloy containing silver may be a thin film (e.g., the thickness is less than or equal to 50 nm, preferably less than or equal to 30 nm) so that visible light can be transmitted.

[Insulating Film]

For the insulating films 32, 34, 40, 44, 48, 54, 62, 68, and 72, an inorganic insulating material, an organic insulating material, or an insulating composite material including an inorganic insulating material and an organic insulating material can be used.

Examples of the inorganic insulating material include a silicon oxide film, a silicon nitride film, a silicon oxynitride film, a silicon nitride oxide film, and an aluminum oxide film. Alternatively, a plurality of the above inorganic materials may be stacked.

Examples of the above organic insulating material include materials that include polyester, polyolefin, polyamide (e.g., nylon or aramid), polyimide, polycarbonate, polyurethane, an acrylic-based resin, an epoxy-based resin, and a resin having a siloxane bond. As the organic insulating material, a photosensitive material may be used.

[Oxide Semiconductor Film]

The oxide semiconductor films 50a, 50b, 56a, and 56b are formed using an oxide such as an In-M-Zn oxide (M is Al, Ga, Y, or Sn). Alternatively, an In—Ga oxide or an In—Zn oxide may be used for the oxide semiconductor films 50a, 50b, 56a, and 56b. Note that an oxide semiconductor film that can be used as the oxide semiconductor films 50a, 50b, 56a, and 56b will be described in detail in Embodiment 3.

[Liquid Crystal Layer]

As examples of the liquid crystal layer 96, thermotropic liquid crystal, low-molecular liquid crystal, high-molecular liquid crystal, polymer dispersed liquid crystal, ferroelectric liquid crystal, and anti-ferroelectric liquid crystal are given. Alternatively, a liquid crystal material which exhibits a cholesteric phase, a smectic phase, a cubic phase, a chiral nematic phase, an isotropic phase, or the like may be used. Furthermore, a liquid crystal material exhibiting a blue phase may be used.

For a driving method of the liquid crystal layer 96, an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used. In addition, the liquid crystal layer 96 can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode.

[EL Layer]

The EL layer 76 includes at least a light-emitting material. Examples of the light-emitting material include an organic compound and an inorganic compound such as a quantum dot. In this specification, a layer including the light-emitting material is also referred to as a light-emitting layer.

The organic compound and the inorganic compound can be formed by an evaporation method (including a vacuum evaporation method), an ink-jet method, a coating method, or gravure printing, for example.

Examples of materials that can be used for the organic compound include a fluorescent material and a phosphorescent material. A fluorescent material is preferably used in terms of the lifetime, while a phosphorescent material is preferably used in terms of the efficiency. Furthermore, both of a fluorescent material and a phosphorescent material may be used.

A quantum dot is a semiconductor nanocrystal with a size of several nanometers and contains approximately $1 \times 10^3$ to $1 \times 10^6$ atoms. Since energy shift of quantum dots depends on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high emission efficiency. Furthermore, since a quantum dot which is an inorganic compound has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; triiron tetraoxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is an effective material to obtain blue light because the emission wavelength can be changed by changing the percentages of the elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophenes; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength region of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots emit directional light polarized in the c-axis direction; thus, quantum rods can be used as a light-emitting material to obtain a light-emitting element with higher external quantum efficiency.

In most EL elements, to improve emission efficiency, light-emitting materials are dispersed in host materials and the host materials need to be substances each having a singlet excitation energy or a triplet excitation energy higher than or equal to that of the light-emitting material. In the case of using a blue phosphorescent material, it is particularly difficult to develop a host material which has a triplet excitation energy higher than or equal to that of the blue phosphorescent material and which is excellent in terms of a lifetime. On the other hand, even when a light-emitting layer is composed of quantum dots and made without a host material, the quantum dots enable emission efficiency to be ensured; thus, a light-emitting element which is favorable in terms of a lifetime can be obtained. In the case where the light-emitting layer is composed of quantum dots, the quantum dots preferably have core-shell structures (including core-multishell structures).

[Alignment Film]

For the alignment films 94 and 98, a material containing polyimide or the like can be used. For example, a material containing polyimide or the like may be subjected to a rubbing process or an optical alignment process to have alignment in a predetermined direction.

[Coloring Film]

The coloring film 69 functions as a color filter. For the coloring film 69, a material transmitting light of a predetermined color (e.g., a material transmitting light of blue, green, red, yellow, or white) is used.

[Structure Body]

For the structure body, an organic material, an inorganic material, or an insulating material containing a composite material of an organic material and an inorganic material can be used. For the insulating material, the materials for the insulating films 32, 34, 40, 44, 48, 54, 62, 68, and 72 can be used.

[Sealing Material]

For the sealing material 82, an inorganic material, an organic material, a composite material of an inorganic material and an organic material, or the like can be used. Examples of the organic material include a thermally fusible resin and a curable resin. As the sealing material 82, an adhesive including a resin material (e.g., a reactive curable adhesive, a photocurable adhesive, a thermosetting adhesive, or an anaerobic adhesive) may be used. Examples of such resin materials include an epoxy-based resin, an acrylic-based resin, a silicone-based resin, a phenol-based resin, a polyimide-based resin, an imide-based resin, a polyvinyl chloride (PVC) based resin, a polyvinyl butyral (PVB) based resin, and an ethylene vinyl acetate (EVA) based resin.

Although not illustrated in FIGS. 1A and 1B, FIG. 2, FIG. 3, FIG. 4, FIG. 5, FIG. 6, FIGS. 7A and 7B, FIGS. 8A and 8B, FIGS. 9A and 9B, FIGS. 10A and 10B, FIGS. 11A and 11B, FIGS. 12A and 12B, FIG. 13, FIG. 14, FIG. 15, FIG. 16, FIG. 17, FIG. 18, FIG. 19, FIG. 20, FIG. 21, FIG. 22, FIG. 23, and FIG. 24, the display device 500 may include components described below.

[Functional Film]

The display device 500 may include a functional film in contact with one or both of the substrates 80 and 90. As the functional film, a polarizing plate, a retardation plate, a diffusing film, an anti-reflective film, a condensing film, or the like can be used. Alternatively, an antistatic film preventing the attachment of a foreign substance, a water repellent film suppressing the attachment of stain, a hard coat film suppressing generation of a scratch in use, or the like can be used for the functional film.

[Light-Blocking Film]

The display device 500 may include a light-blocking film suppressing light transmission between adjacent pixels. Examples of the material for the light-blocking film include a metal material and an organic resin material containing a black pigment.

In this manner, the first to third display elements can be controlled separately with the use of different transistors in the display device of one embodiment of the present invention. Accordingly, a display device having high display quality can be provided.

The structures described in this embodiment can be used in appropriate combination with any of the structures described in the other embodiments.

Embodiment 2

In this embodiment, the display device of one embodiment of the present invention in which an input device is provided will be described with reference to FIGS. 25A and 25B, FIG. 26, FIG. 27, and FIGS. 28A and 28B.

<2-1. Description of Input Device>

In this embodiment, a touch panel 2000 including the display device 500 and an input device will be described. In addition, an example in which a touch sensor is used as an input device will be described.

Figure 25A:
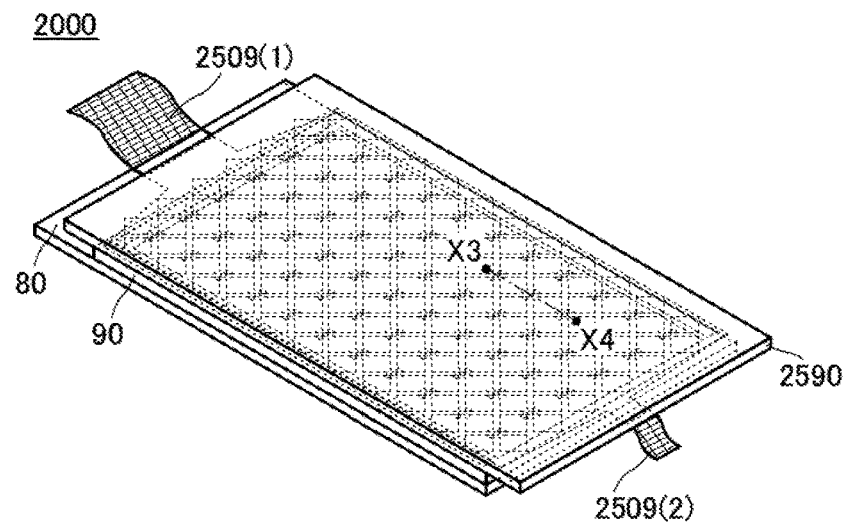
FIGS. 25A and 25B are perspective views illustrating an example of a touch panel.
Figure 25B:
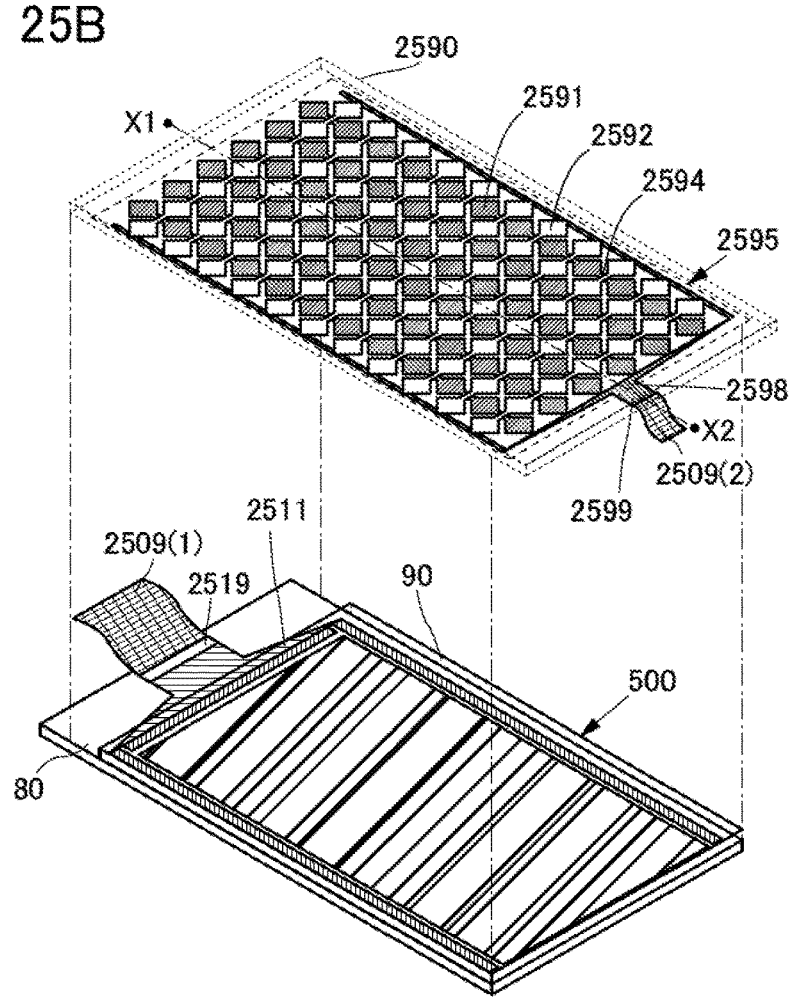

FIGS. 25A and 25B are perspective views of the touch panel 2000. Note that FIGS. 25A and 25B illustrate typical components of the touch panel 2000 for simplicity.

The touch panel 2000 includes the display device 500 and a touch sensor 2595 (see FIGS. 25A and 25B). The touch panel 2000 includes the substrate 80, the substrate 90, and a substrate 2590.

The display device 500 includes a plurality of pixels over the substrate 80 and a plurality of wirings 2511 through which signals are supplied to the pixels. The plurality of wirings 2511 are led to a peripheral portion of the substrate 80, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 25B, electrodes, wirings, and the like of the touch sensor 2595 provided on the back side of the substrate 2590 (the side facing the substrate 80) are indicated by solid lines for clarity.

As the touch sensor 2595, a capacitive touch sensor can be used, for example. Examples of the capacitive touch sensor include a surface capacitive touch sensor and a projected capacitive touch sensor.

Examples of the projected capacitive touch sensor are a self-capacitive touch sensor and a mutual capacitive touch sensor, which differ mainly in the driving method. The use of the mutual capacitive touch sensor is preferable because multiple points can be sensed simultaneously. Note that the touch sensor 2595 illustrated in FIG. 25B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 25A and 25B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<2-2. Description of Touch Sensor>

Figure 26:
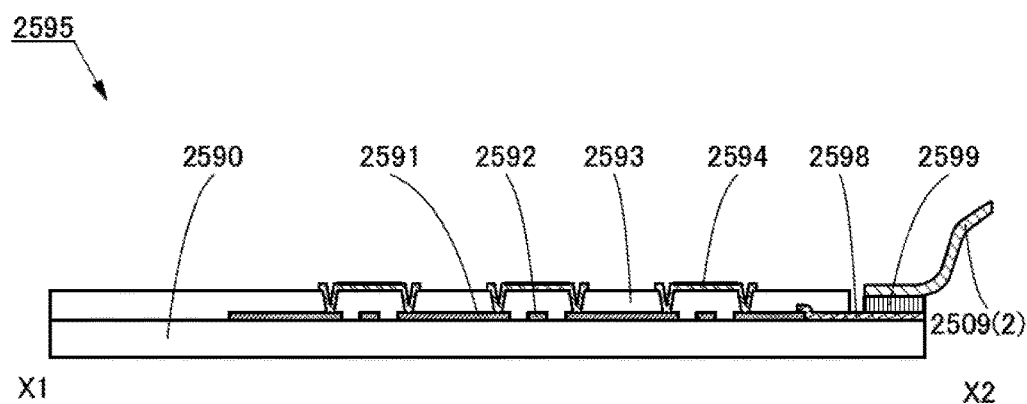
FIG. 26 is a cross-sectional view illustrating an example of a touch sensor.

Next, the touch sensor 2595 will be described in detail with reference to FIG. 26. FIG. 26 corresponds to a cross-sectional view taken along dashed-dotted line X1-X2 in FIG. 25B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 include a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

One wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<2-3. Description of Touch Panel>

Figure 27:
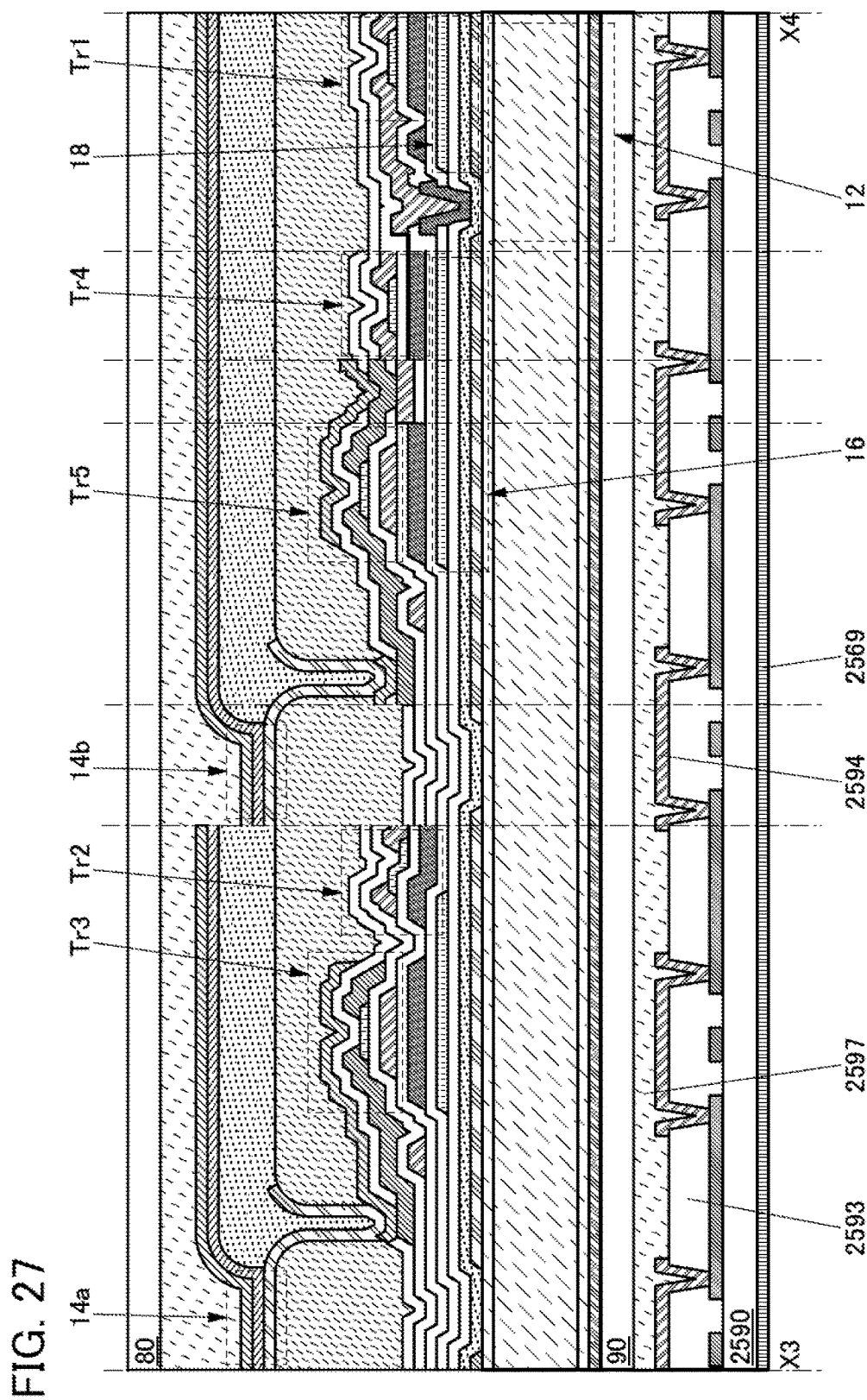
FIG. 27 is a cross-sectional view illustrating an example of a touch panel.

Next, the touch panel 2000 will be described in detail with reference to FIG. 27. FIG. 27 corresponds to a cross-sectional view taken along dashed-dotted line X3-X4 in FIG. 25A.

In the touch panel 2000 illustrated in FIG. 27, the display device 500 including the pixel 10 described with reference to FIG. 4 and FIG. 5 and the touch sensor 2595 described with reference to FIG. 26 are attached to each other.

The touch panel 2000 illustrated in FIG. 27 includes an adhesive layer 2597 and an anti-reflective layer 2569 in addition to the display device 500 including the pixel 10 described with reference to FIG. 4 and FIG. 5 and the touch sensor 2595 described with reference to FIG. 26.

The adhesive layer 2597 is provided in contact with the wiring 2594. Note that the adhesive layer 2597 attaches the substrate 2590 to the substrate 90 so that the touch sensor 2595 overlaps with the display device 500. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with the pixel 10. As the anti-reflective layer 2569, a circularly polarizing plate can be used, for example.

The touch panel 2000 is an out-cell touch panel. Note that one embodiment of the present invention is not limited to the above structure, and an in-cell touch panel or an on-cell touch panel may be employed.

<2-4. Description of Driving Method of Touch Panel>

Next, an example of a driving method of a touch panel will be described with reference to FIGS. 28A and 28B.

Figure 28A:
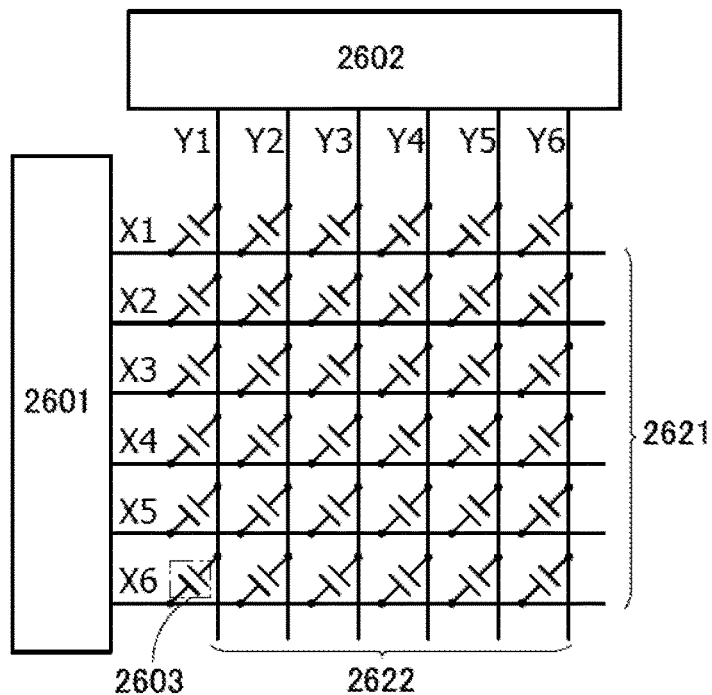
FIGS. 28A and 28B are a block diagram and a timing chart of a touch sensor.

FIG. 28A is a block diagram illustrating the structure of a mutual capacitive touch sensor. FIG. 28A illustrates a pulse voltage output circuit 2601 and a current sensing circuit 2602. Note that in FIG. 28A, six wirings X1 to X6 represent the electrodes 2621 to which a pulse voltage is applied, and six wirings Y1 to Y6 represent the electrodes 2622 that detect changes in current. FIG. 28A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 28B:
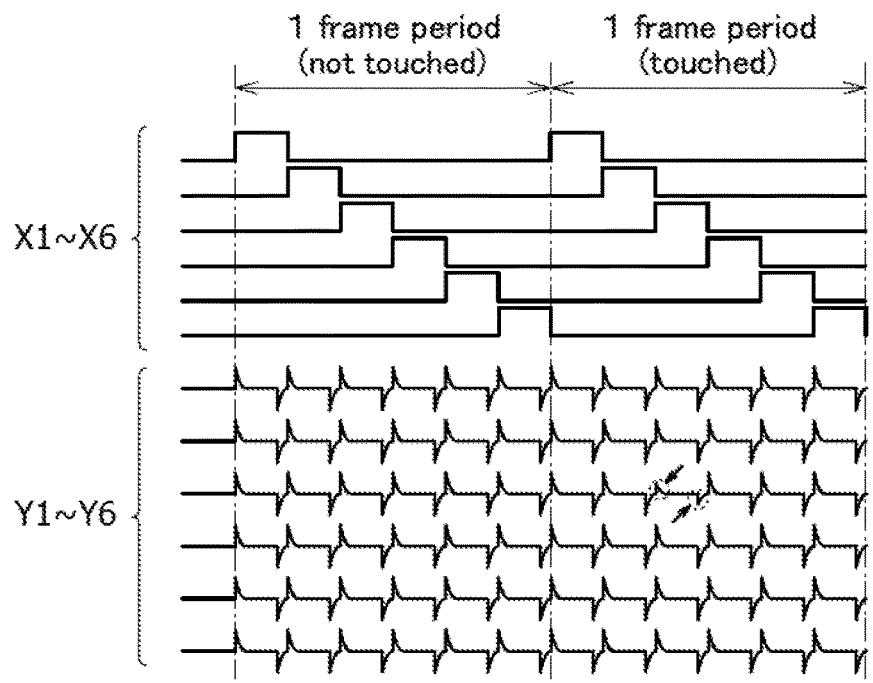

FIG. 28B is a timing chart showing input and output waveforms in the mutual capacitive touch sensor illustrated in FIG. 28A. In FIG. 28B, sensing of a sensing target is performed in all the rows and columns in one frame period. FIG. 28B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be detected.

The structures described in this embodiment can be used in appropriate combination with any of the structures described in the other embodiments.

Embodiment 3

In this embodiment, a metal oxide that can be used for an oxide semiconductor film of a transistor in one embodiment of the present invention will be described.

<3-1. Metal Oxide>

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, CAC-OS or CAC-metal oxide can be called a matrix composite or a metal matrix composite.

The structures described in this embodiment can be used in appropriate combination with any of the structures described in the other embodiments.

Embodiment 4

In this embodiment, a display module and electronic devices that include the display device of one embodiment of the present invention will be described with reference to FIG. 29, FIGS. 30A to 30E, and FIGS. 31A to 31E.

<4-1. Display Module

Figure 29:
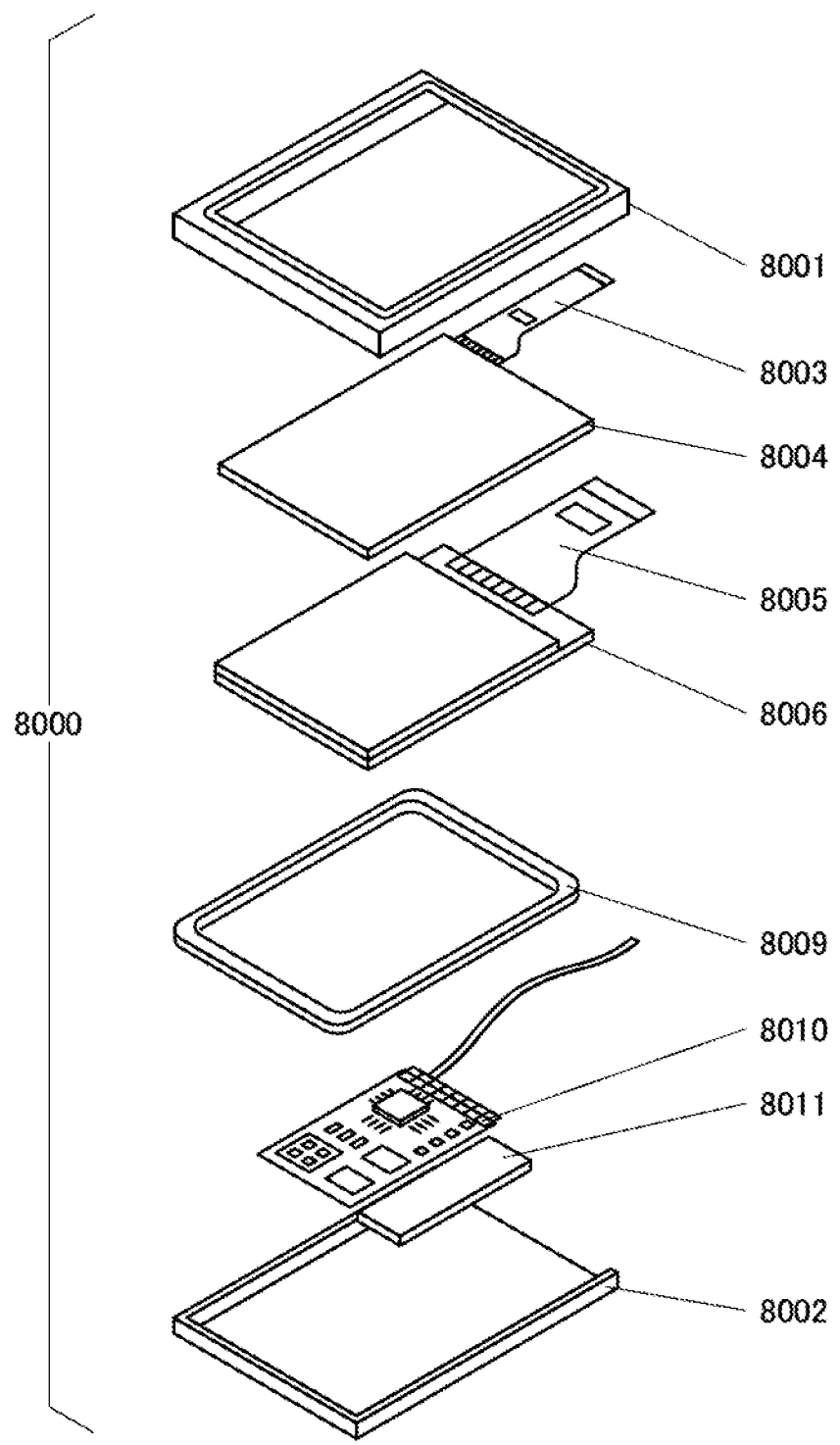
FIG. 29 illustrates a display module.

In a display module 8000 illustrated in FIG. 29, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Alternatively, a counter substrate (sealing substrate) of the display panel 8006 can have a touch panel function. Alternatively, a photosensor may be provided in each pixel of the display panel 8006 so as to function as an optical touch panel.

The frame 8009 protects the display panel 8006 and functions as an electromagnetic shield for blocking electromagnetic waves generated by the operation of the printed circuit board 8010. The frame 8009 may function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<4-2. Electronic Device>

FIGS. 30A to 30E and FIGS. 31A to 31E illustrate electronic devices. These electronic devices can include a housing 9000, a display portion 9001, a camera 9002, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 30A to 30E and FIGS. 31A to 31E can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions of the electronic devices illustrated in FIGS. 30A to 30E and FIGS. 31A to 31E are not limited thereto, and the electronic devices may have other functions.

The electronic devices illustrated in FIGS. 30A to 30E and FIGS. 31A to 31E are described in detail below.

Figure 30A:
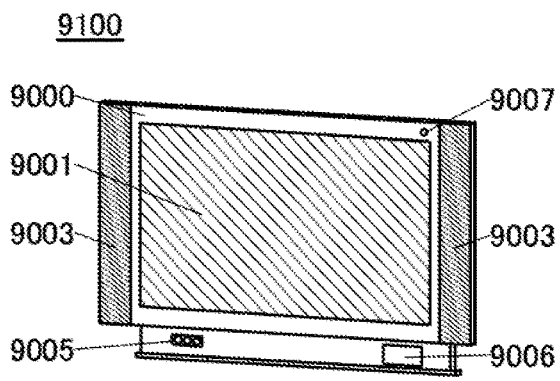
FIGS. 30A to 30E illustrate electronic devices.

FIG. 30A is a perspective view illustrating a television device 9100. The television device 9100 can include the display portion 9001 having a large screen size of, for example, 50 inches or more, 80 inches or more, or 100 inches or more.

FIG. 30B, FIG. 30C, FIG. 30D, and FIG. 30E are perspective views illustrating a portable information terminal 9101, a portable information terminal 9102, a portable information terminal 9103, and a portable information terminal 9104, respectively.

Figure 30B:
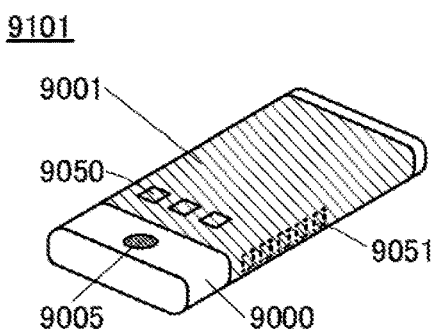

The portable information terminal 9101 illustrated in FIG. 30B functions as, for example, one or more of a telephone set, a notebook, and an information browsing system. Specifically, the portable information terminal 9101 can be used as a smartphone. Although not illustrated, the speaker 9003, the connection terminal 9006, the sensor 9007, and the like may be provided in the portable information terminal 9101. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface (for example, a side surface) of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the strength of a received signal. Alternatively, the operation buttons 9050 or the like may be displayed in place of the information 9051. The display portion 9001 of the portable information terminal 9101 partly has a curved surface.

Figure 30D:
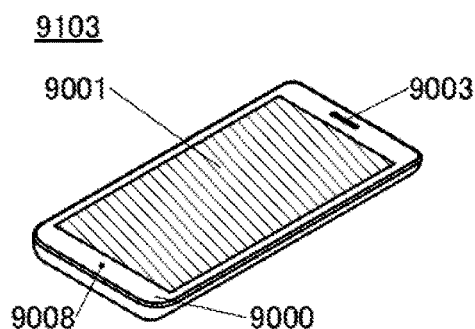
Figure 30C:
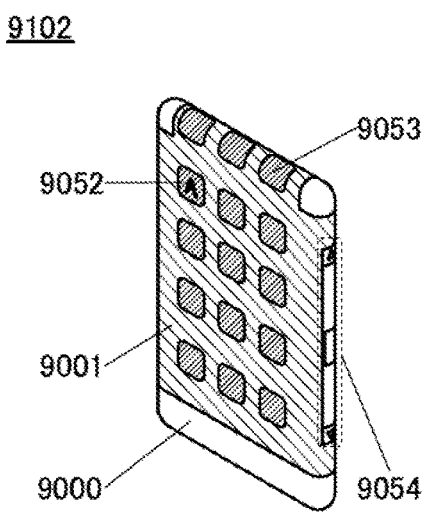

The portable information terminal 9102 illustrated in FIG. 30C has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call. The display portion 9001 of the portable information terminal 9102 partly has a curved surface.

Unlike in the portable information terminals 9101 and 9102 described above, the display portion 9001 does not have a curved surface in the portable information terminal 9103 illustrated in FIG. 30D.

Figure 30E:
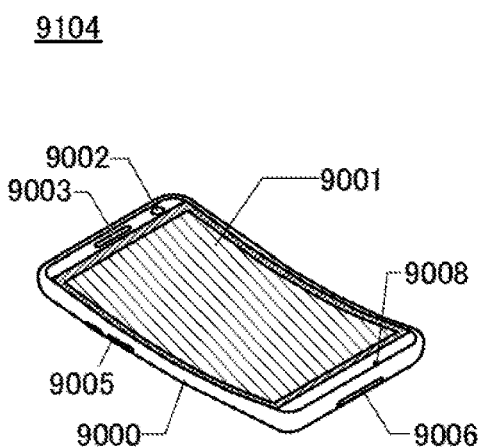

The display portion 9001 of the portable information terminal 9104 illustrated in FIG. 30E is curved. As illustrated in FIG. 30E, it is preferable that the portable information terminal 9104 be provided with the camera 9002 to have a function of taking a still image, a function of taking a moving image, a function of storing the taken image in a memory medium (an external memory medium or a memory medium incorporated in the camera), a function of displaying the taken image on the display portion 9001, or the like.

Figure 31A:
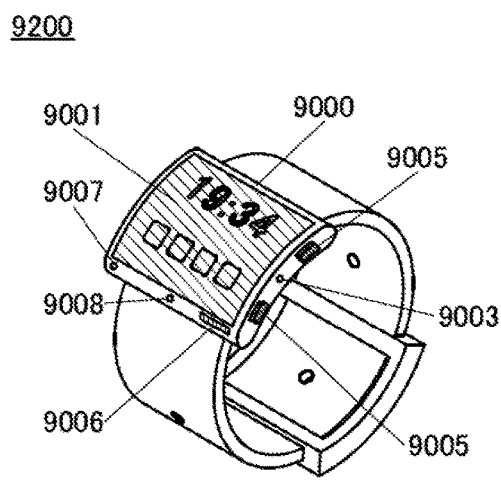
FIGS. 31A to 31E are perspective views illustrating display devices.
Figure 31B:
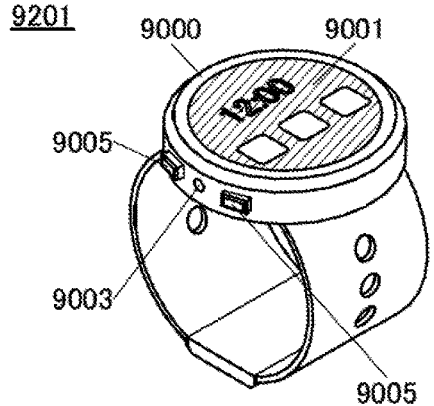

FIG. 31A is a perspective view of a watch-type portable information terminal 9200. FIG. 31B is a perspective view of a watch-type portable information terminal 9201.

The portable information terminal 9200 illustrated in FIG. 31A is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication that is a communication method based on an existing communication standard. For example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Unlike in the portable information terminal 9200 illustrated in FIG. 31A, the display surface of the display portion 9001 is not curved in the portable information terminal 9201 illustrated in FIG. 31B. Furthermore, the external state of the display portion of the portable information terminal 9201 is a non-rectangular shape (a circular shape in FIG. 31B).

Figure 31C:
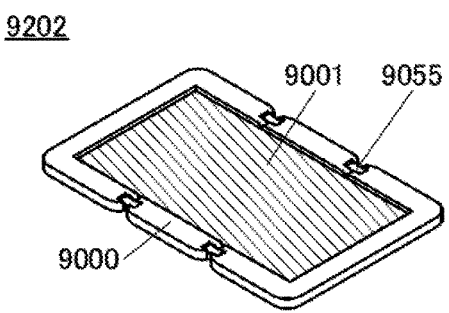
Figure 31D:
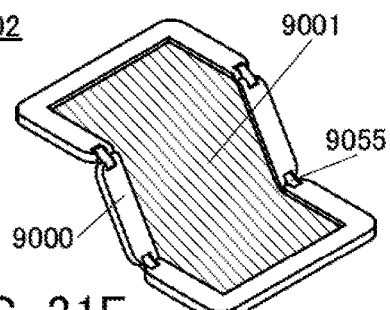
Figure 31E:
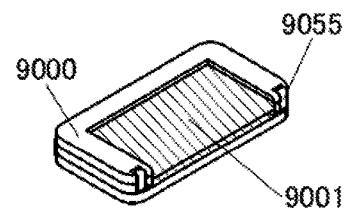

FIGS. 31C, 31D, and 31E are perspective views of a foldable portable information terminal 9202. FIG. 31C is a perspective view illustrating the portable information terminal 9202 that is opened. FIG. 31D is a perspective view illustrating the portable information terminal 9202 that is shifting from the opened state to the folded state or from the folded state to the opened state. FIG. 31E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

The display device which is one embodiment of the present invention can be preferably used for the display portion 9001.

Electronic devices described in this embodiment are characterized by having a display portion for displaying some sort of information. Note that the semiconductor device of one embodiment of the present invention can also be used for an electronic device that does not have a display portion.

The structures described in this embodiment can be used in appropriate combination with any of the structures described in the other embodiments.

This application is based on Japanese Patent Application Serial No. 2016-162391 filed with Japan Patent Office on Aug. 23, 2016, the entire contents of which are hereby incorporated by reference.

What is claimed is:

1. A display device comprising:
   a first display element;
   a second display element;
   a first transistor; and
   a second transistor,
   wherein the first display element comprises a first light-emitting layer,
   wherein the first display element is electrically connected to the first transistor,
   wherein the first transistor comprises a first semiconductor film, a first gate electrode and a second gate electrode facing each other with the first semiconductor film provided between the first gate electrode and the second gate electrode, and a first source electrode and a first drain electrode over and in contact with the first semiconductor film,
   wherein the second gate electrode is electrically connected to one of the first source electrode and the first drain electrode,
   wherein the second display element comprises a second light-emitting layer,
   wherein the second display element is electrically connected to the second transistor,
   wherein the second transistor comprises a second semiconductor film and a third gate electrode and a fourth gate electrode facing each other with the second semiconductor film provided between the third gate electrode and the fourth gate electrode, and
   wherein the fourth gate electrode is electrically connected to the third gate electrode.

2. The display device according to claim 1,
   wherein the first light-emitting layer emits one of red light, green light, and white light, and
   wherein the second light-emitting layer emits blue light.

3. The display device according to claim 1, further comprising a third display element, wherein the third display element comprises a liquid crystal layer.

4. The display device according to claim 3, wherein one of the first light-emitting layer and the second light-emitting layer is configured to emit light toward a liquid crystal layer side.

5. The display device according to claim 1, wherein one of the first transistor and the second transistor comprises a semiconductor film comprising a metal oxide.

6. A display module comprising:
the display device according to claim 1; and
a touch sensor.

7. An electronic device comprising:
the display device according to claim 1; and
an operation key or a battery.

8. A display device comprising:
a first display element;
a second display element;
a first transistor; and
a second transistor,
wherein the first display element comprises a first light-emitting layer,
wherein the first transistor comprises a first semiconductor film, a first gate electrode and a second gate electrode facing each other with the first semiconductor film provided between the first gate electrode and the second gate electrode, and a first source electrode and a first drain electrode over and in contact with the first semiconductor film,
wherein the second gate electrode is electrically connected to one of the first source electrode and the first drain electrode,
wherein the one of the first source electrode and the first drain electrode is electrically connected to the first display element,
wherein the second display element comprises a second light-emitting layer,
wherein the second transistor comprises a second semiconductor film, a third gate electrode and a fourth gate electrode facing each other with the second semiconductor film provided between the third gate electrode and the fourth gate electrode, and a second source electrode and a second drain electrode over and in contact with the second semiconductor film,
wherein the fourth gate electrode is electrically connected to the third gate electrode, and
wherein one of the second source electrode and the second drain electrode is electrically connected to the second display element.

9. The display device according to claim 8,
wherein the first light-emitting layer emits one of red light, green light, and white light, and
wherein the second light-emitting layer emits blue light.

10. The display device according to claim 8, further comprising a third display element, wherein the third display element comprises a liquid crystal layer.

11. The display device according to claim 10, wherein one of the first light-emitting layer and the second light-emitting layer is configured to emit light toward a liquid crystal layer side.

12. The display device according to claim 8, wherein one of the first transistor and the second transistor comprises a semiconductor film comprising a metal oxide.

13. A display module comprising:
the display device according to claim 8; and
a touch sensor.

14. An electronic device comprising:
the display device according to claim 8; and
an operation key or a battery.

* * * * *